United States Patent
Kim et al.

(10) Patent No.: US 8,300,453 B2
(45) Date of Patent: Oct. 30, 2012

(54) METHOD FOR RECORDING OF INFORMATION IN MAGNETIC RECORDING ELEMENT AND METHOD FOR RECORDING OF INFORMATION IN MAGNETIC RANDOM ACCESS MEMORY

(75) Inventors: Sang-Koog Kim, Seoul (KR); Ki-Suk Lee, Seoul (KR); Young-Sang Yu, Seoul (KR)

(73) Assignee: Snu R&DB Foundation, Seoul (KR)

( * ) Notice: Subject to any disclaimer, the term of this patent is extended or adjusted under 35 U.S.C. 154(b) by 248 days.

(21) Appl. No.: 12/738,655

(22) PCT Filed: Oct. 17, 2008

(86) PCT No.: PCT/KR2008/006150
§ 371 (c)(1),
(2), (4) Date: Apr. 19, 2010

(87) PCT Pub. No.: WO2009/051441
PCT Pub. Date: Apr. 23, 2009

(65) Prior Publication Data
US 2010/0290281 A1 Nov. 18, 2010

(30) Foreign Application Priority Data

Oct. 19, 2007 (KR) .................. 10-2007-0105590
Oct. 19, 2007 (KR) .................. 10-2007-0105600

(51) Int. Cl.
*G11C 11/14* (2006.01)

(52) U.S. Cl. .................. 365/171; 365/158; 365/173
(58) Field of Classification Search .............. 365/130, 365/131, 158, 171, 173, 32, 33
See application file for complete search history.

(56) References Cited

U.S. PATENT DOCUMENTS

| 6,925,002 B2 * | 8/2005 | Schwarzl .................. 365/158 |
| 2002/0196658 A1 * | 12/2002 | Mukasa et al. .............. 365/173 |

(Continued)

FOREIGN PATENT DOCUMENTS

| JP | 2002-175623 A | 6/2002 |
| JP | 2004-193479 A | 7/2004 |
| KR | 1999-029127 A | 4/1999 |

(Continued)

OTHER PUBLICATIONS

International Search Report: PCT/KR2008/006150.

*Primary Examiner* — Pho M Luu
*Assistant Examiner* — Thao Bui
(74) *Attorney, Agent, or Firm* — Ladas & Parry LLP

(57) ABSTRACT

Provided are a method for recording information in a magnetic recording element and a method for recording information in a magnetic random access memory. The method for recording information in a magnetic recording element includes preparing the magnetic recording element having a magnetic free layer in which a magnetic vortex is formed. A current or a magnetic field whose direction varies with time is applied to the magnetic free layer to switch a core orientation of a magnetic vortex formed in the magnetic free layer to an upward direction or downward direction from a top surface of the magnetic free layer "0" or "1" is assigned according to the direction of the core orientation of the magnetic vortex formed in the magnetic free layer. According to the method for recording information in a magnetic recording element of the present invention, the core orientation of the magnetic vortex formed in the magnetic free layer of the magnetic recording element can be selectively switched by applying a current or magnetic field whose direction varies with time to the magnetic recording element, so that information can be easily and correctly recorded, lower power is consumed in recording information, and the switching for recording information can be performed very rapidly.

18 Claims, 16 Drawing Sheets

| U.S. PATENT DOCUMENTS | | | |
|---|---|---|---|
| 2006/0023492 A1* | 2/2006 | Min et al. | 365/158 |
| 2007/0090903 A1* | 4/2007 | Clinton et al. | 335/202 |
| 2009/0147562 A1* | 6/2009 | Clinton et al. | 365/158 |
| 2009/0180311 A1 | 7/2009 | Ono et al. | |

| FOREIGN PATENT DOCUMENTS | | |
|---|---|---|
| KR | 2005-0008562 A | 1/2005 |
| KR | 2006-0118013 A | 11/2006 |
| WO | 2007/105358 A1 | 9/2007 |

* cited by examiner

[Fig. 1]
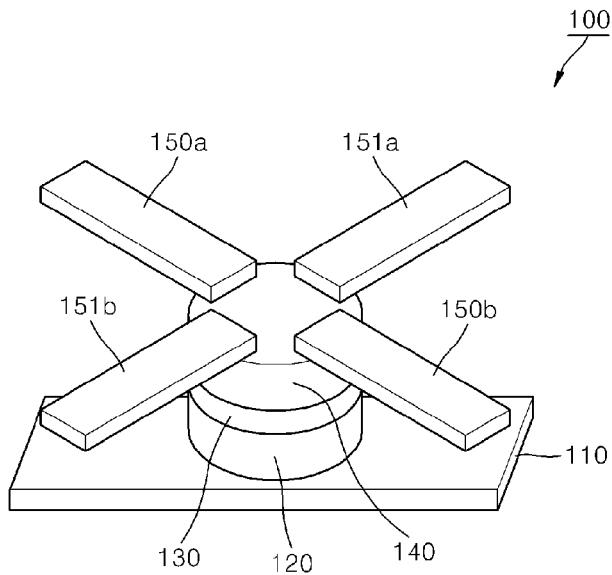
[Fig. 2]
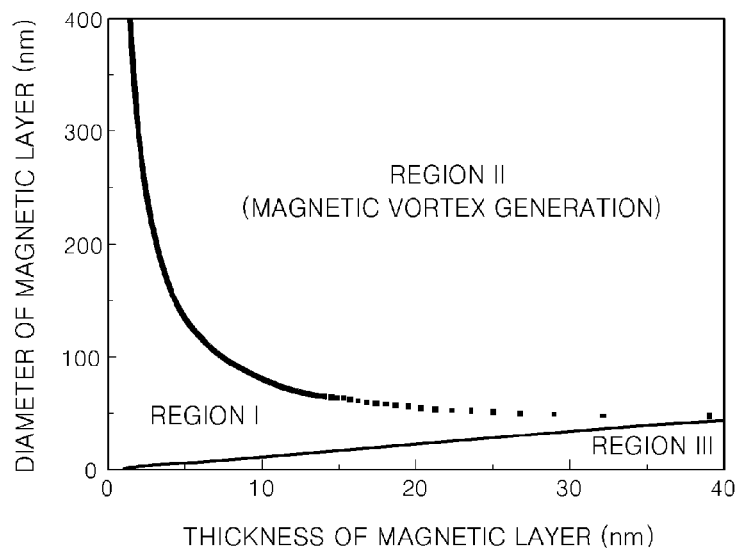
[Fig. 3]
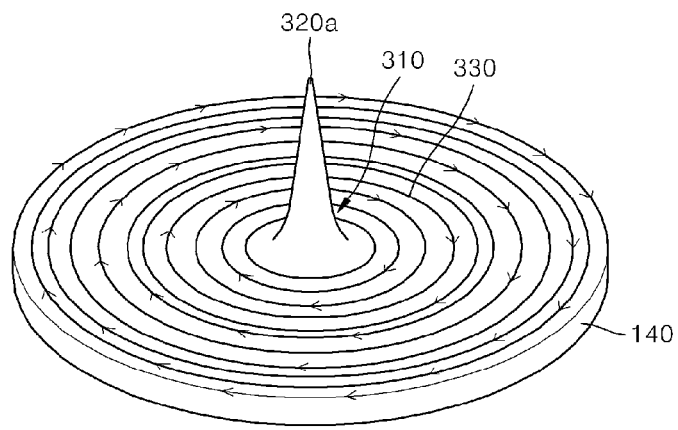

[Fig. 4]
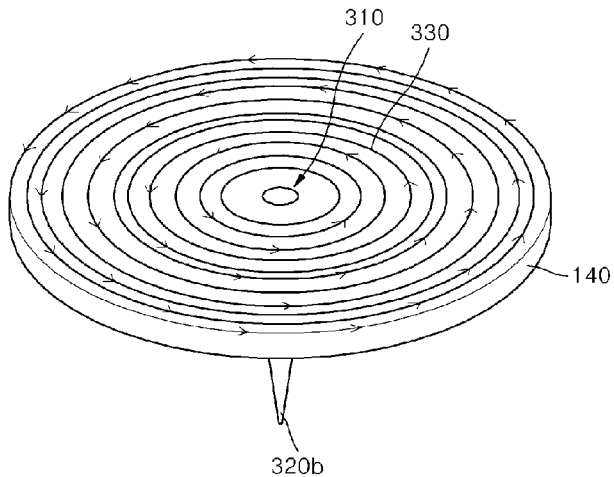
[Fig. 5]
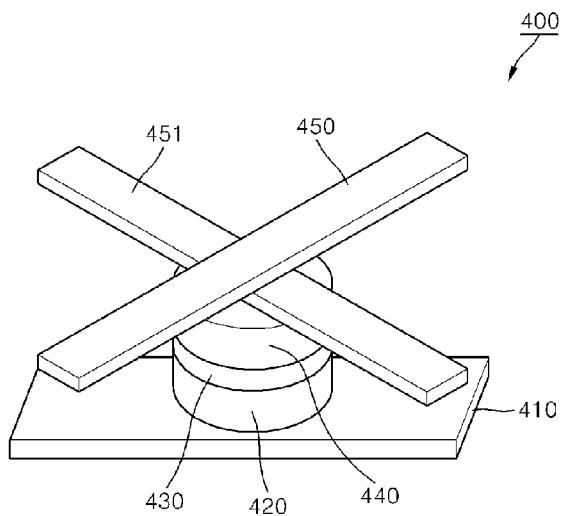
[Fig. 6]
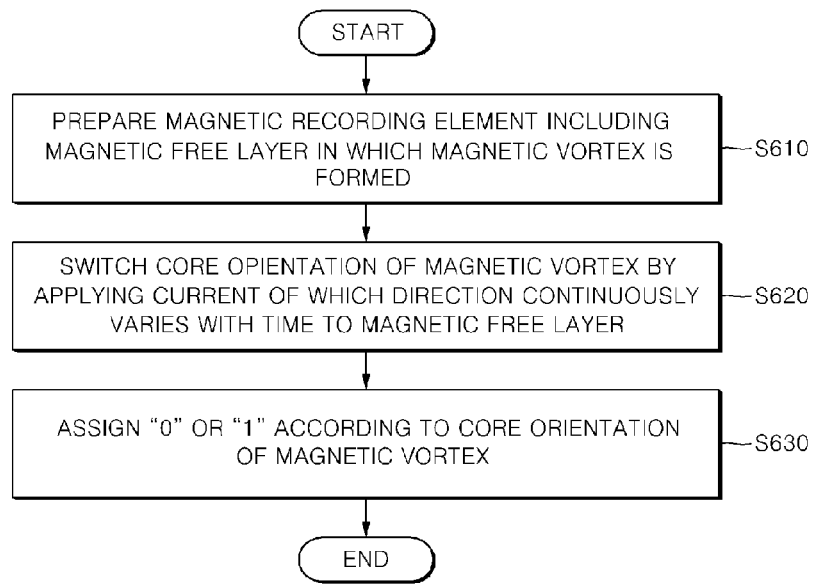

[Fig. 7]
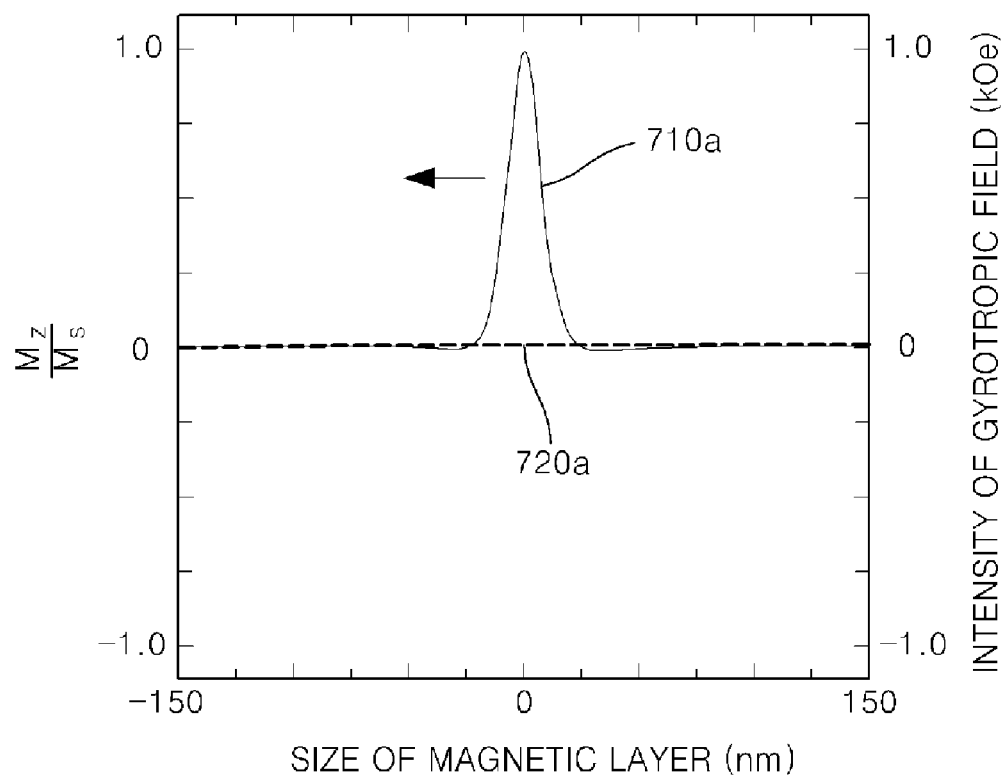
[Fig. 8]
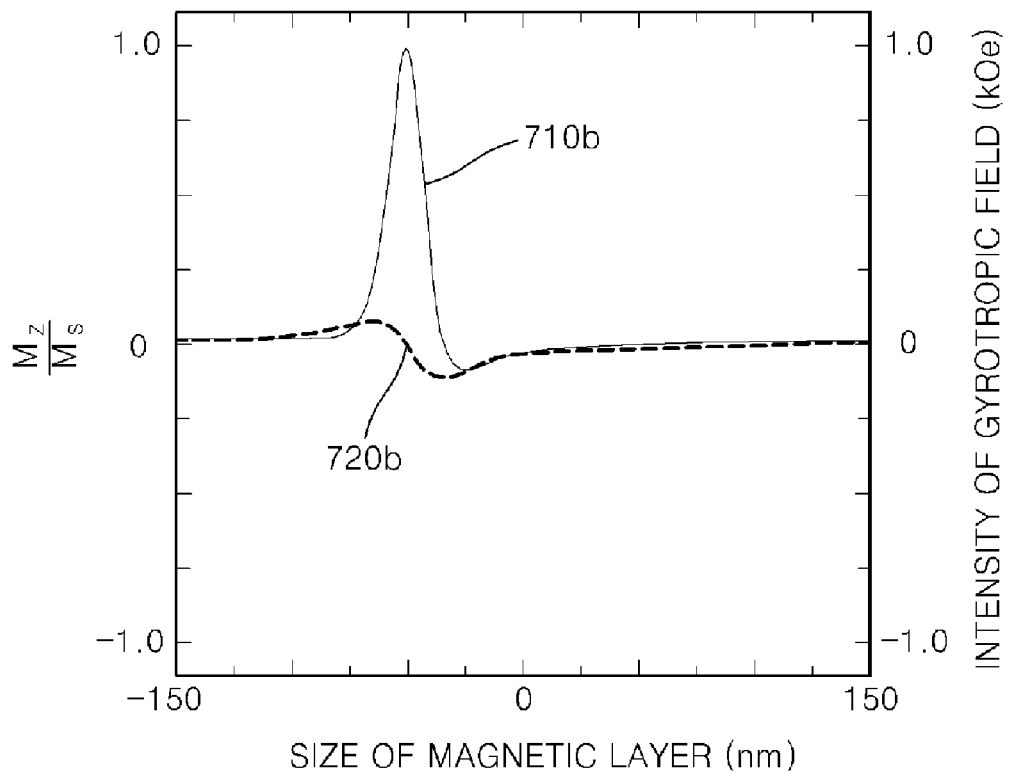

[Fig. 9]
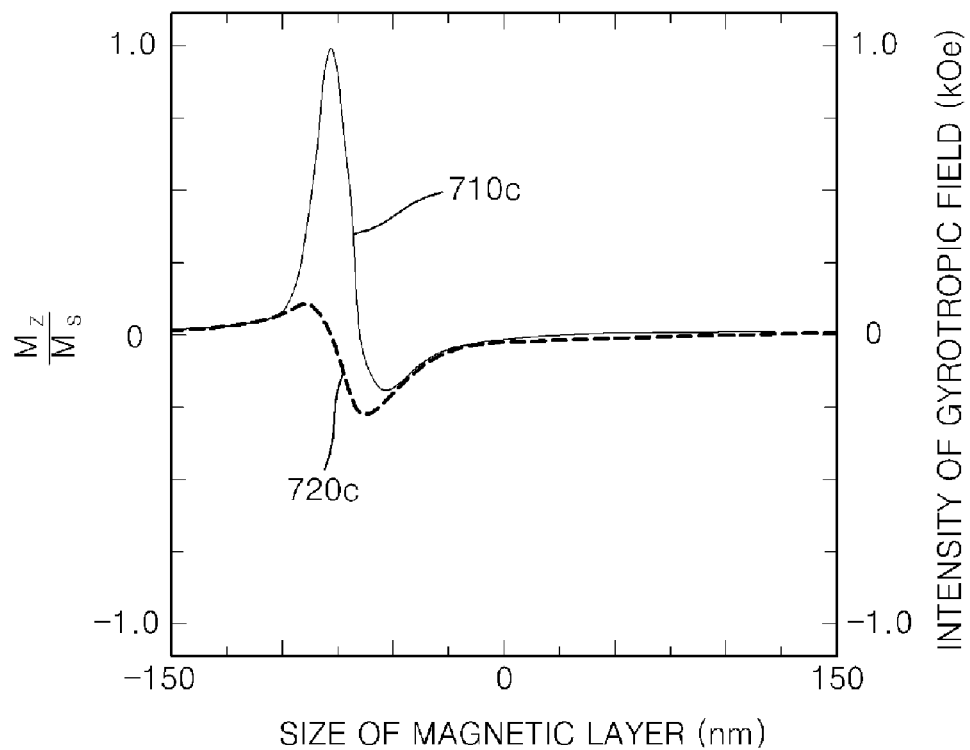
[Fig. 10]
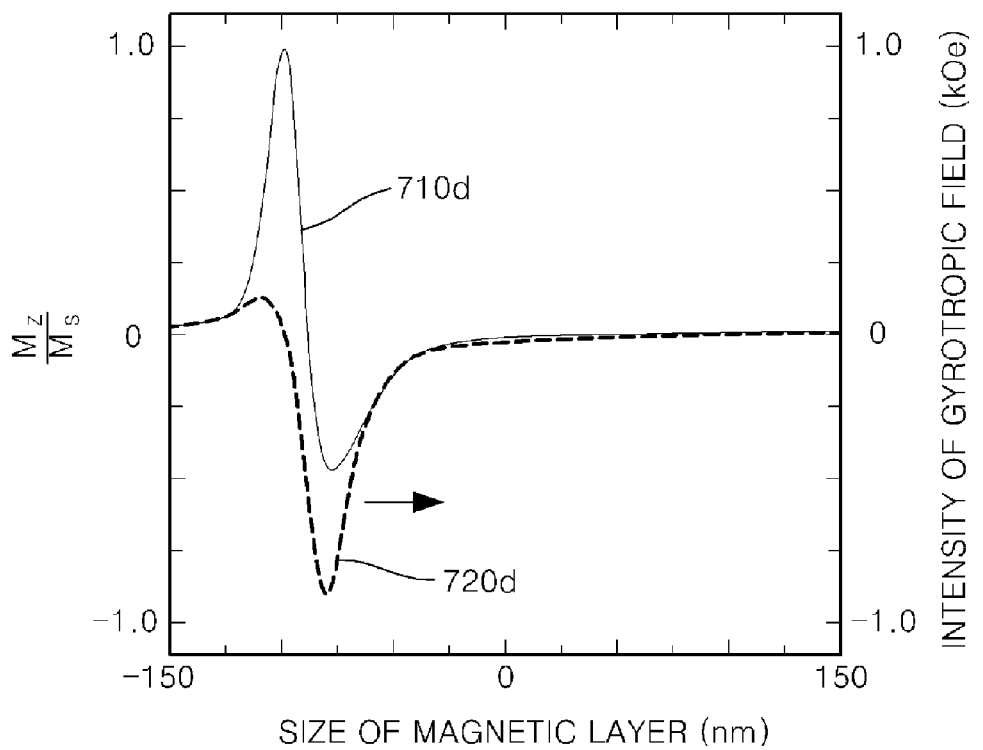

[Fig. 11]
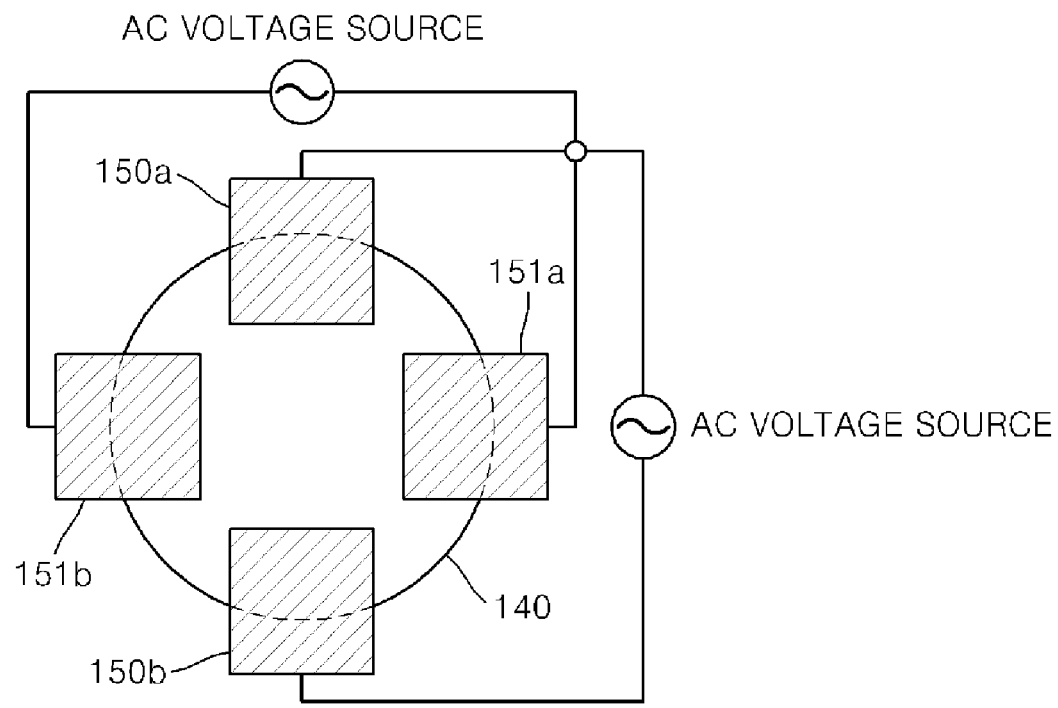
[Fig. 12]
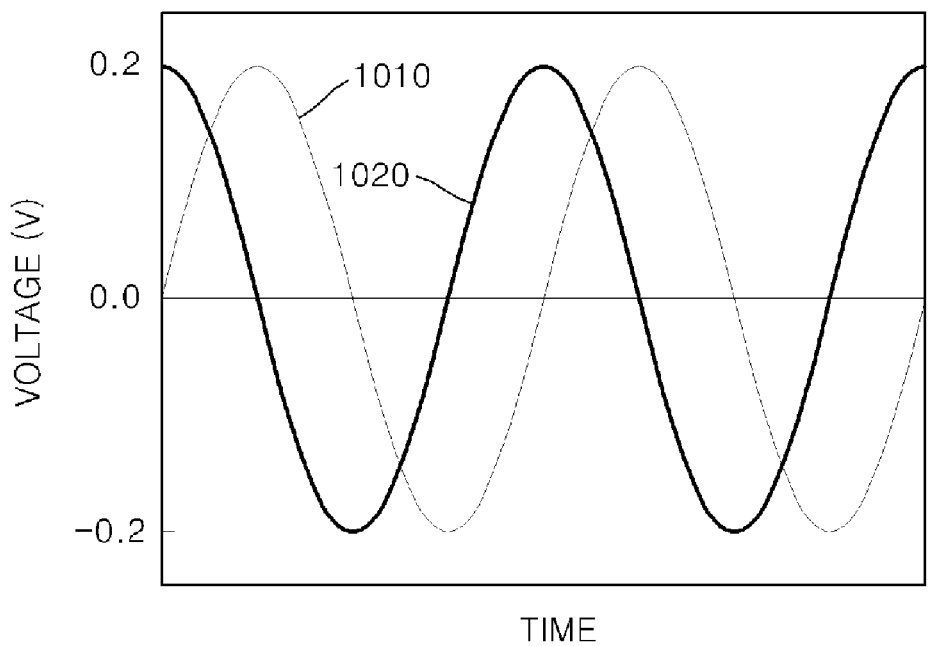

[Fig. 13]
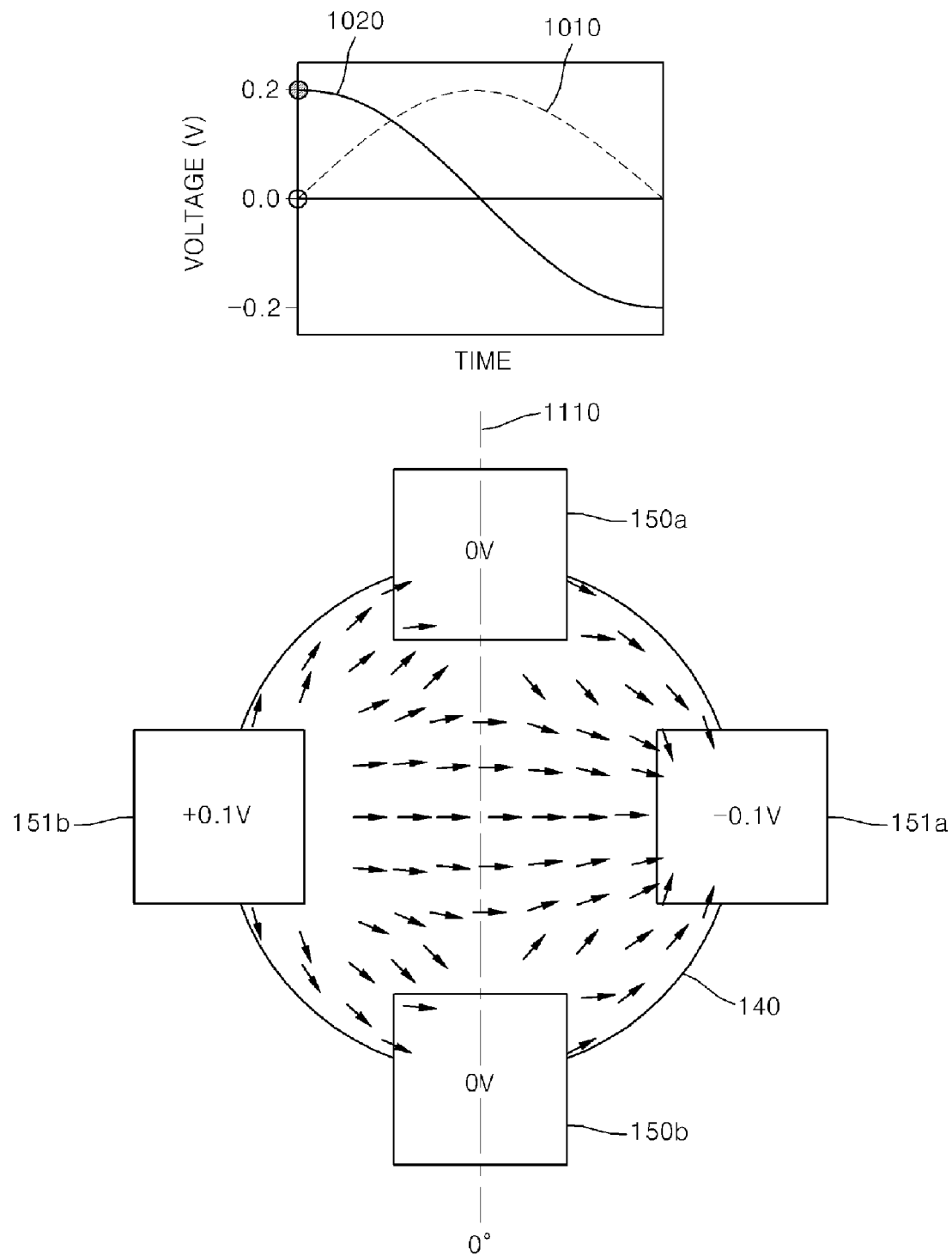

[Fig. 14]
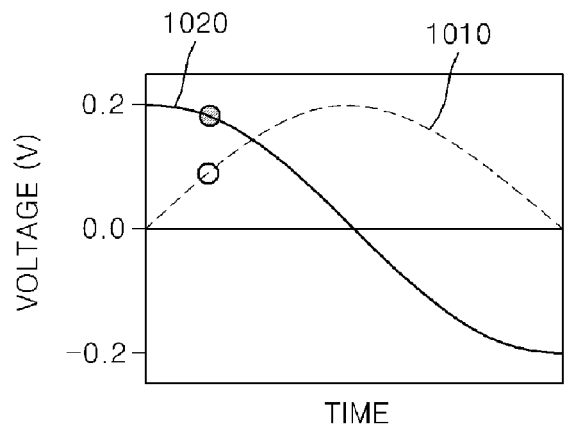
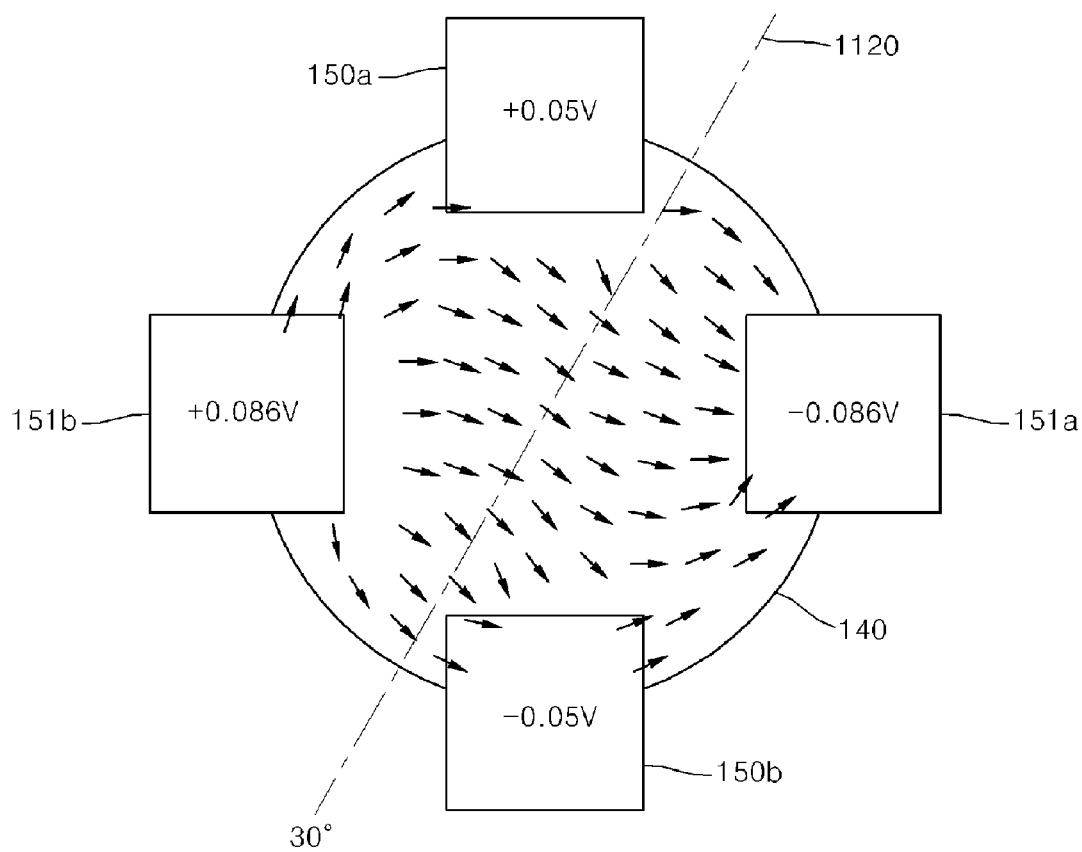

[Fig. 15]
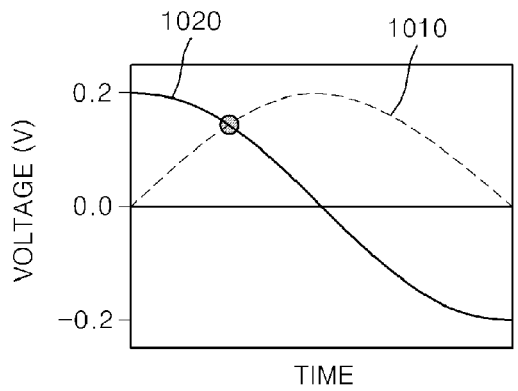
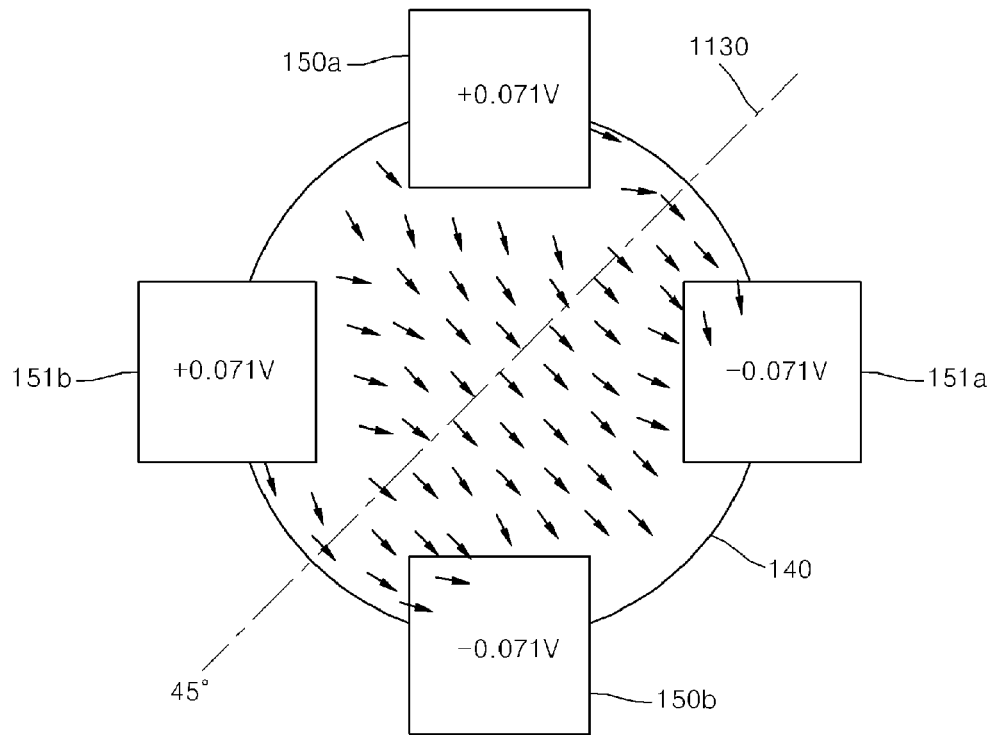
[Fig. 16]
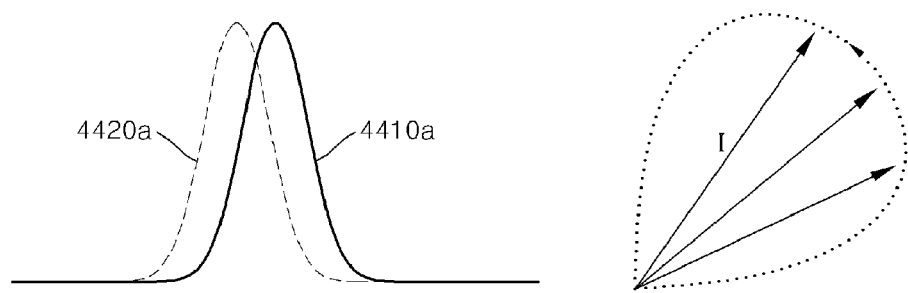

[Fig. 17]
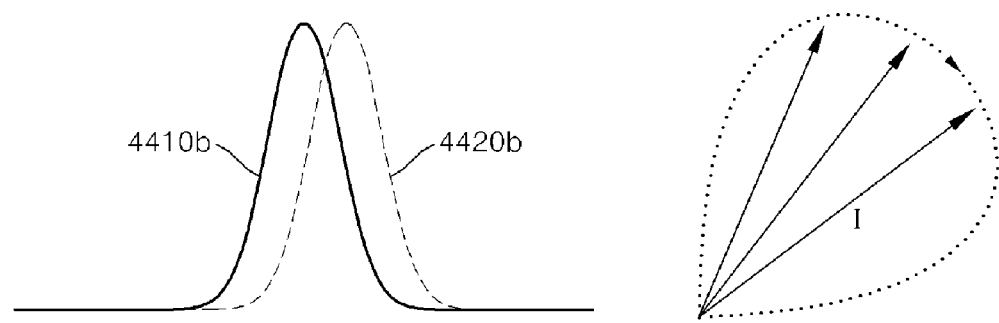
[Fig. 18]
[Fig. 19]
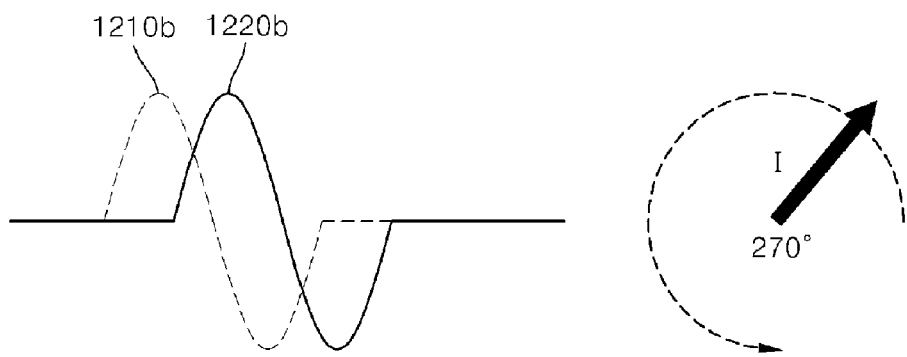
[Fig. 20]
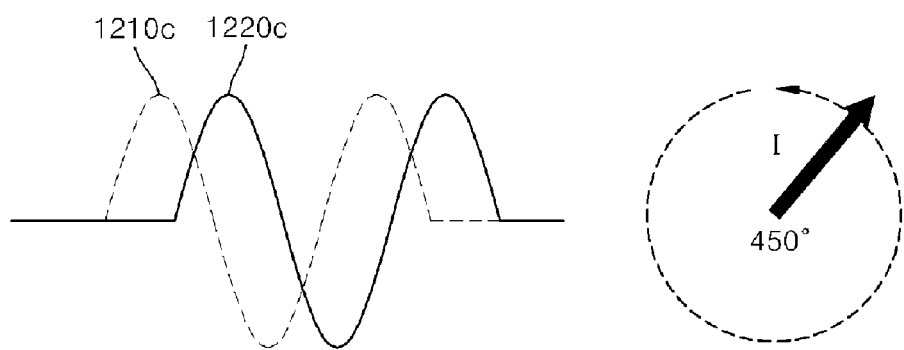

[Fig. 21]
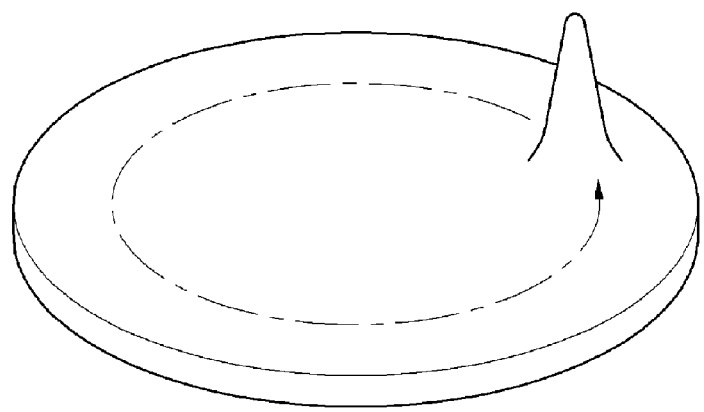
[Fig. 22]
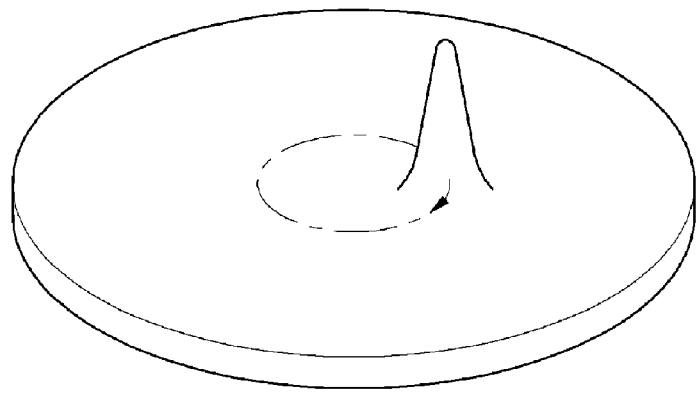
[Fig. 23]
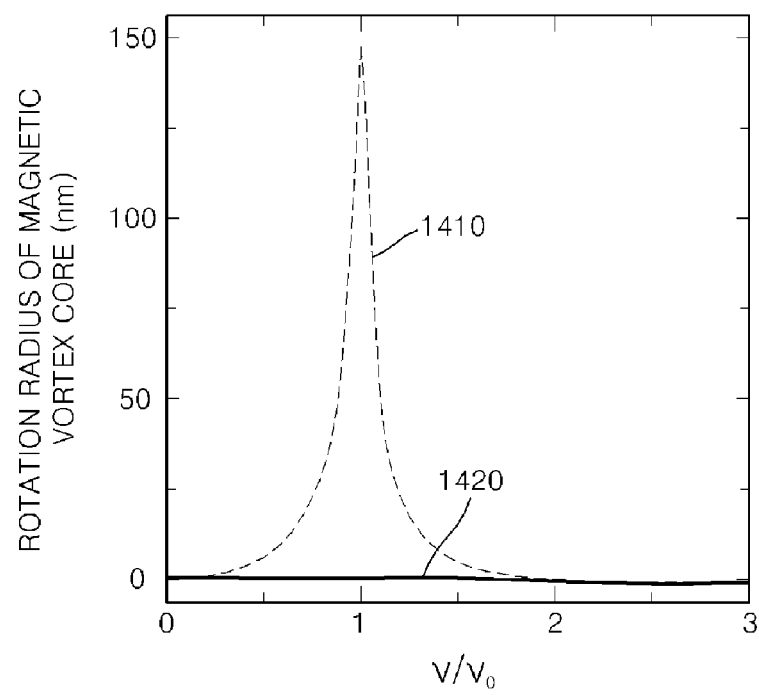

[Fig. 24]
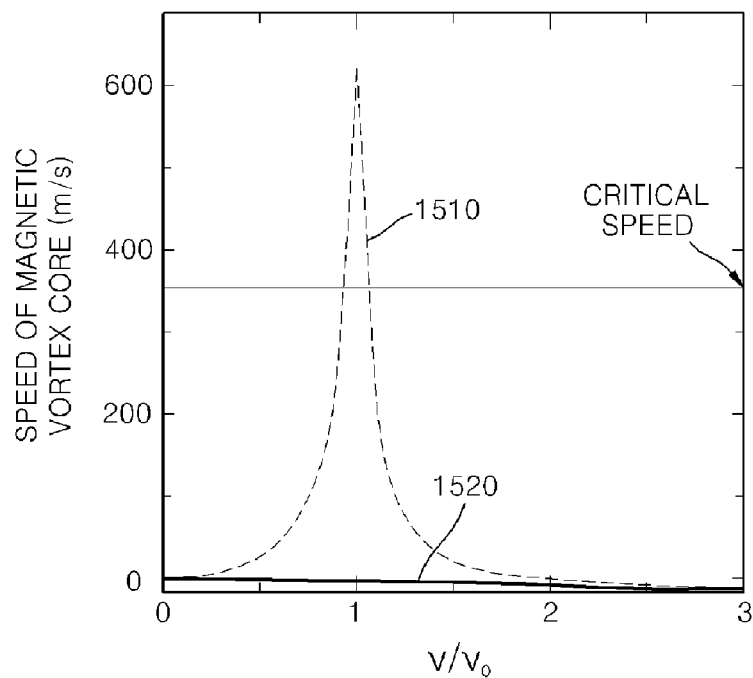
[Fig. 25]
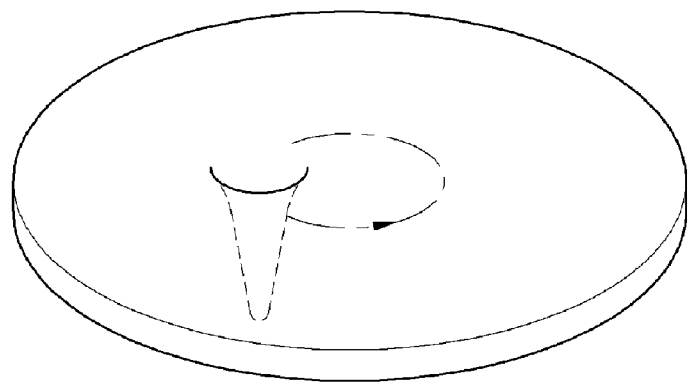
[Fig. 26]
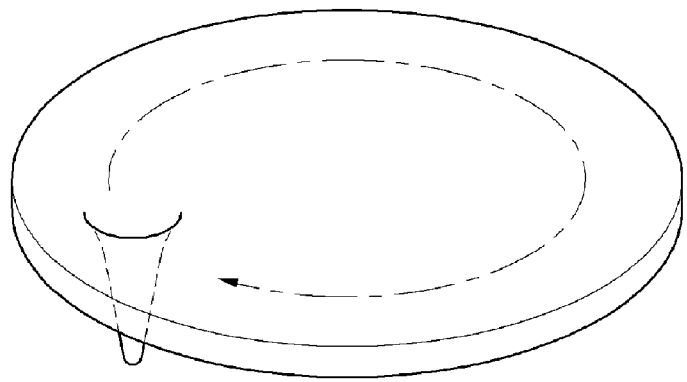

[Fig. 27]
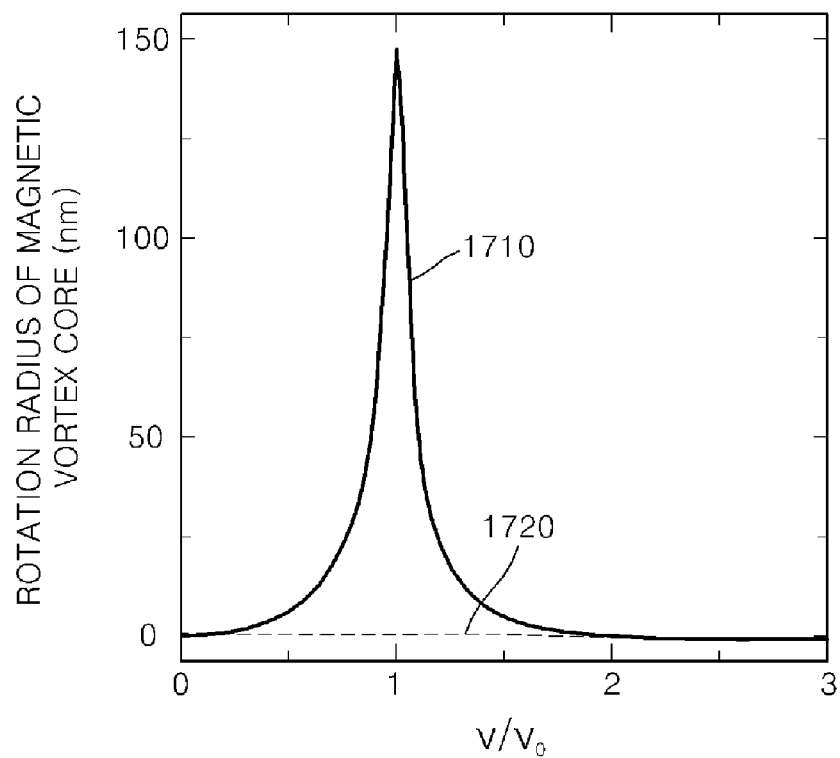
[Fig. 28]
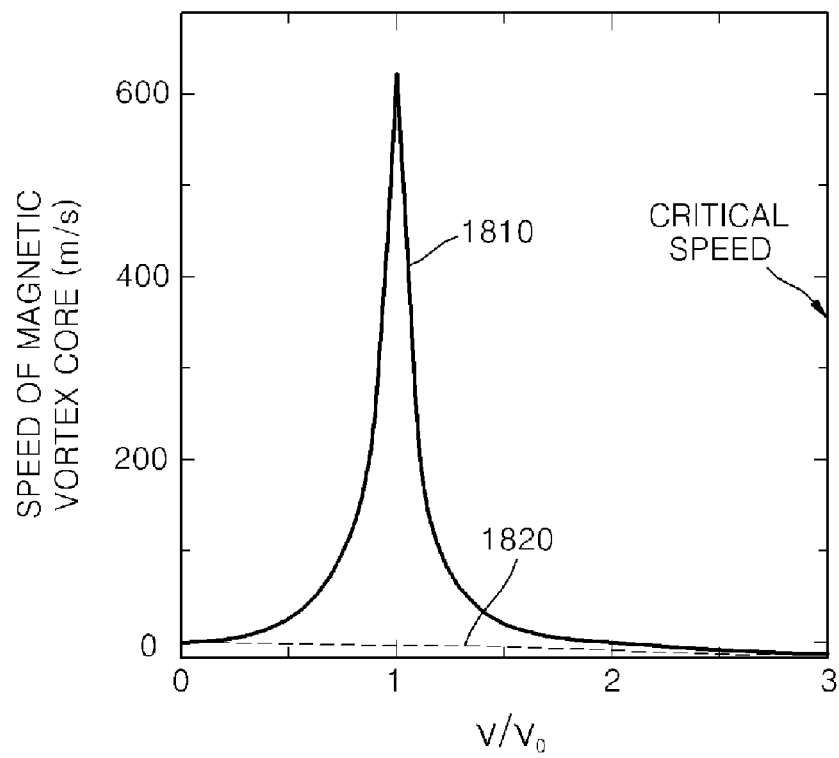

[Fig. 29]
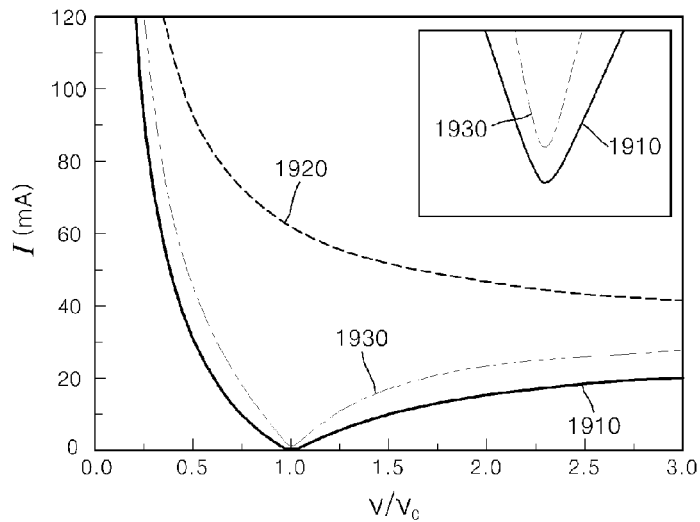
[Fig. 30]
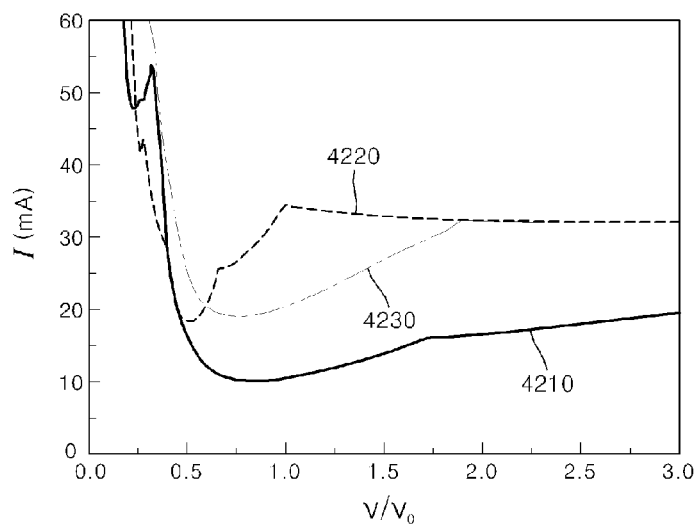
[Fig. 31]
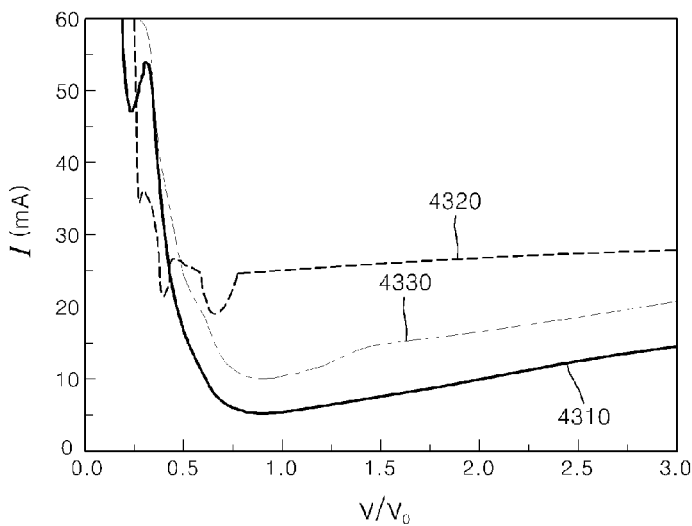

[Fig. 32]
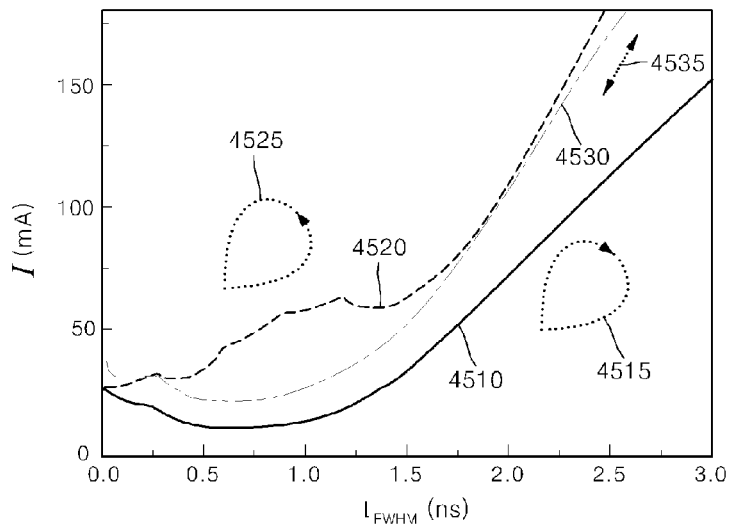
[Fig. 33]
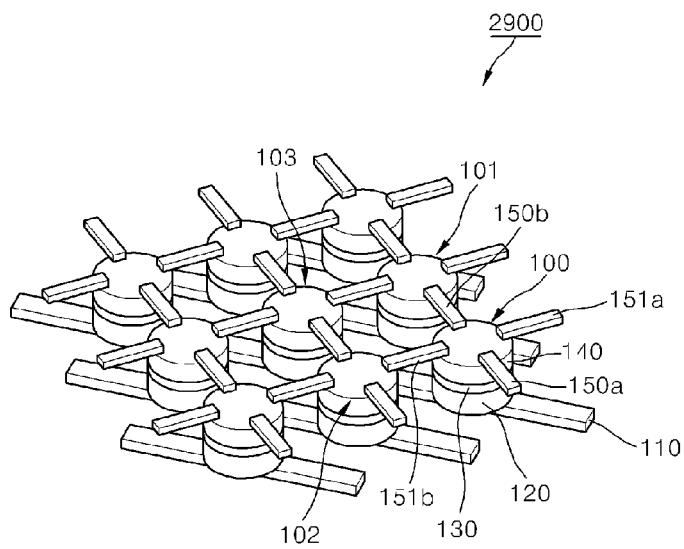
[Fig. 34]
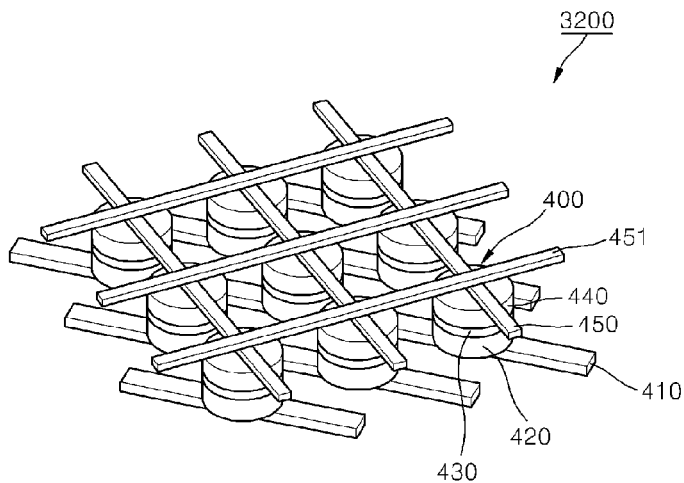

[Fig. 35]
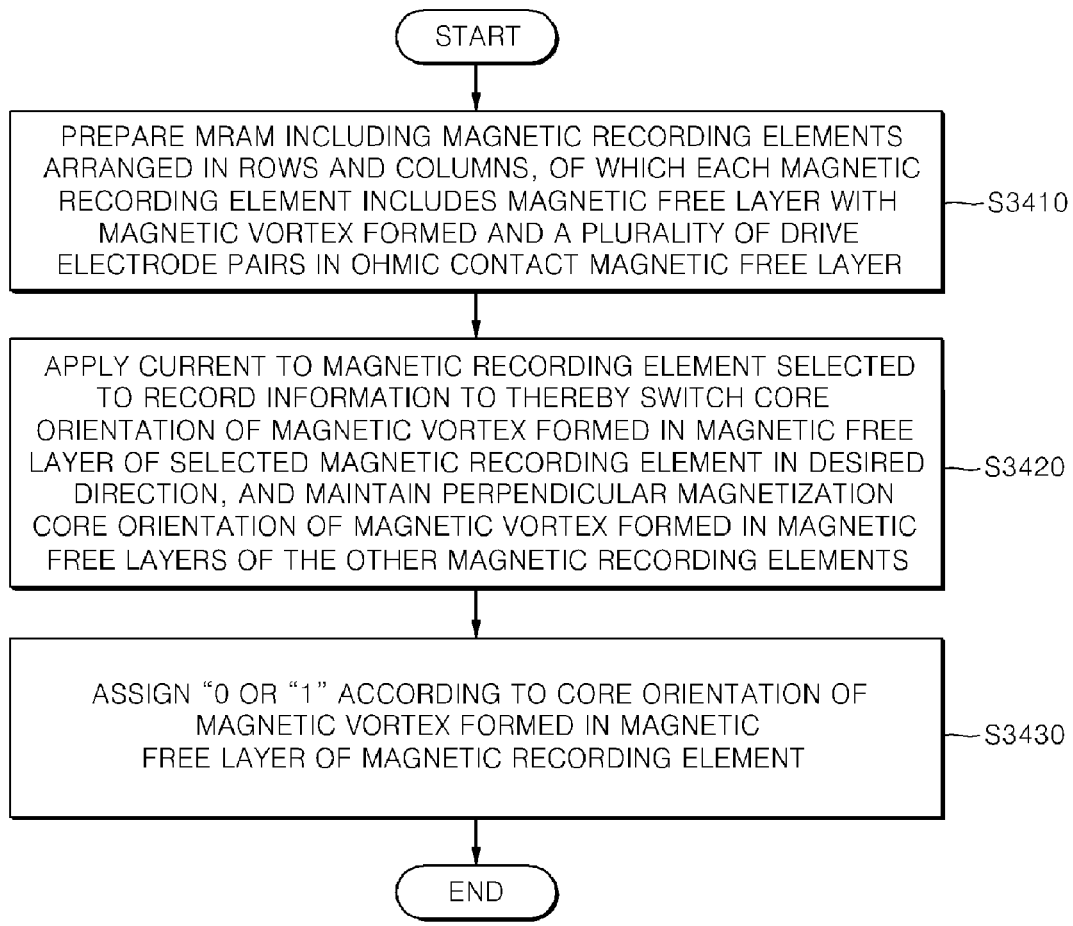
[Fig. 36]
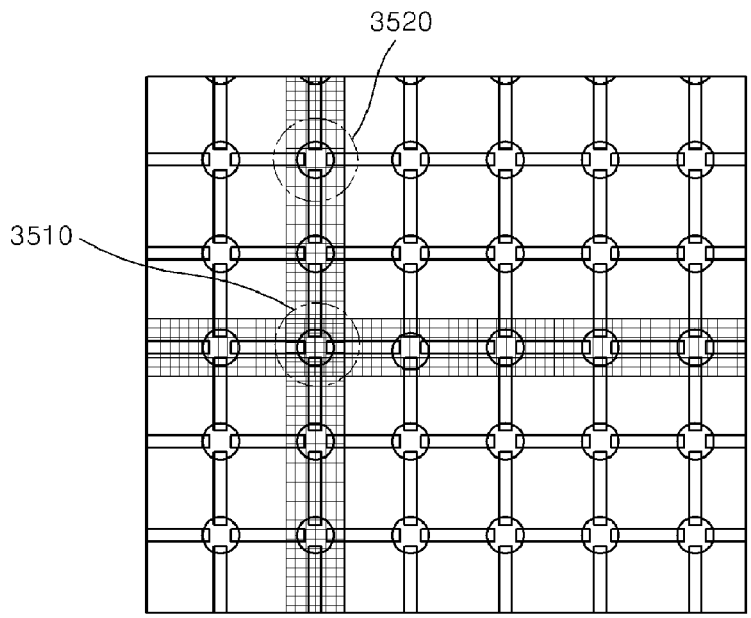

[Fig. 37]
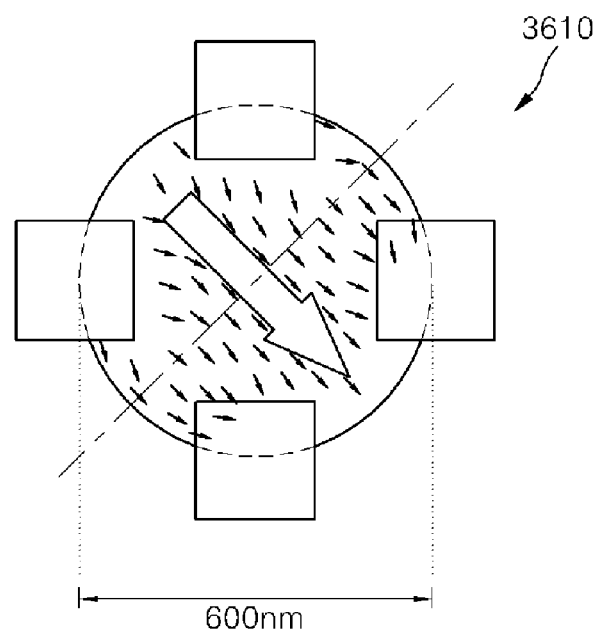
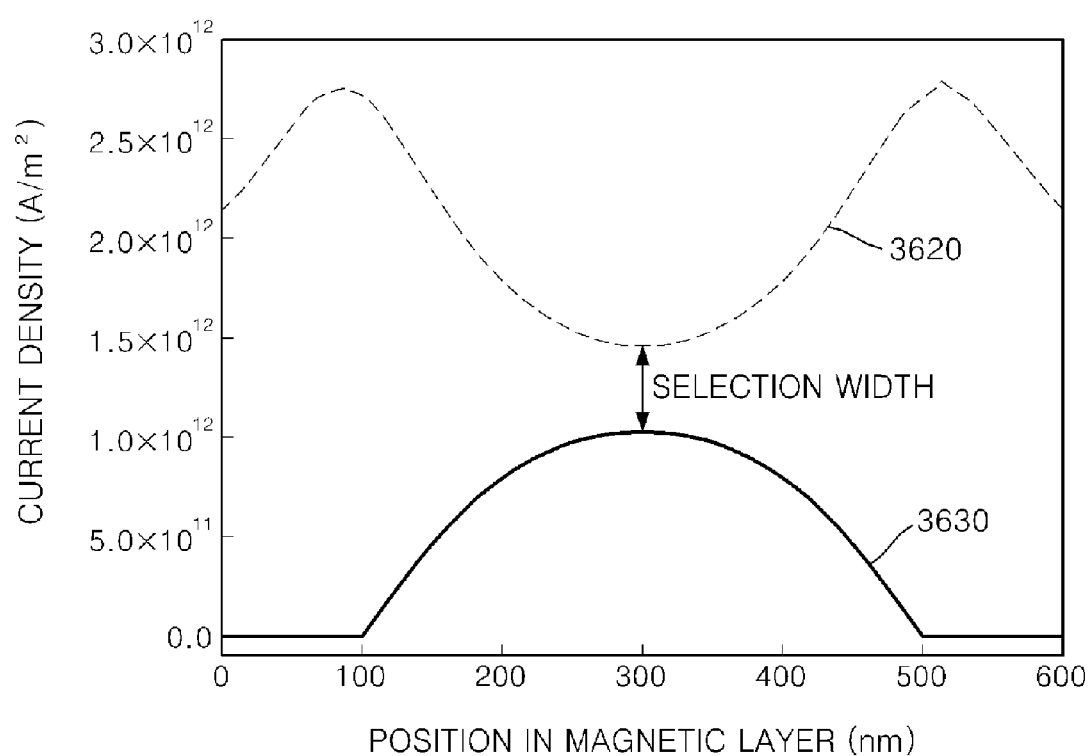

METHOD FOR RECORDING OF INFORMATION IN MAGNETIC RECORDING ELEMENT AND METHOD FOR RECORDING OF INFORMATION IN MAGNETIC RANDOM ACCESS MEMORY

TECHNICAL FIELD

The present invention relates to a magnetic recording element usable in a nonvolatile random access memory, and more particularly, to a method for recording information in a magnetic recording element using a magnetic vortex existing in a magnetic film having a size of less than several micrometers.

BACKGROUND ART

In line with remarkable developments in an information and telecommunication field, there is an increasing demand for various kinds of memory devices. In particular, nonvolatile memory devices, which can retain data even if power is turned off, are demanded as memory devices available for mobile terminals, MP3 players, or the like. Since nonvolatile memory devices can electrically program and erase data, and retain data even though power is not supplied, they are increasingly applied to a variety of fields at present. However, typical dynamic random access memories (DRAMs) are volatile memory devices, and thus lose stored data when power is not supplied. Therefore, many studies are being conducted on nonvolatile memory devices which can be used in place of DRAMs.

Among various kinds of nonvolatile memory devices, researches are mainly being made on a phase RAM (PRAM) using a phase transition phenomenon, a magnetic RAM (MRAM) using a magnetoresistance, a ferroelectric RAM (FRAM) using a ferroelectric effect, and a resistance RAM (ReRAM) using a resistance switching or conductivity switching phenomenon of a metal oxide thin film. In particular, much attention has been paid on MRAMs recently because MRAMs have an operation speed faster than other nonvolatile memory devices, and excellent durability against the repetitive use.

MRAMs are classified into two memories according to a method for read-out of information, of which one is an MRAM using giant magnetoresistance (GMR) effect and the other is an MRAM using tunneling magnetoresistance (TMR) effect. Since the MRAM using the GMR effect has the magnetoresistance less than 10%, a reading speed of information is slow and a signal-to-noise ratio (SNR) is low. Also, the MRAM using the GMR effect may be affected by a magnetic field applied to adjacent magnetic recording elements, and thus the magnetic recording elements should be spaced apart from each other by a predetermined distance or more, leading to a difficulty in achieving high integration.

The MRAM using the TMR effect has a magnetic tunnel junction (MTJ) structure as a basic structure. The MTJ structure is a stack structure where a read electrode, an antiferromagnetic layer, a magnetic pinned layer formed of a ferromagnetic material, an insulating layer, a magnetic free layer formed of a ferromagnetic material, and a drive electrode are formed over a substrate in sequence. Like the MRAM using the GMR effect, the MRAM using the TMR effect stores information using a magnetoresistance difference according to a relative difference in magnetization direction between the magnetic free layer and the magnetic pinned layer. Unlike the MRAM using the GMR effect, however, the MRAM using the TMR effect has a faster reproduction rate and a higher SNR than the MRAM using the GMR effect because it has the magnetoresistance of 20% or more.

In the MRAM using the TMR effect, the resistance of each magnetic recording element greatly varies with a thickness of an insulating layer. Accordingly, information is stored by the use of a resistance difference from an adjacent comparative magnetic recording element at present. If, however, a thickness difference between an insulating layer of a storage magnetic recording element and an insulating layer of a comparative magnetic recording element is 0.2 Å or greater, it is difficult to read out information stored in the magnetic recording element. Therefore, there is a technical problem in that an insulating layer should be conformally formed over a wafer of several inches in radius during a manufacturing process.

As the magnetic recording element shrinks in size, the magnetic free layer and the magnetic pinned layer get close to each other. Therefore, a ferromagnet of the magnetic free layer is affected by a magnetic field of a ferromagnet of the magnetic pinned layer. Such a magnetic field produced by the magnetic pinned layer, that is, a stray field, may have a detrimental effect, for example, a decrease in magnetoresistance, or an increase in coercive force of the magnetic free layer. Especially, the insulating layer in the MTJ structure is thinner than the conductive layer of the MRAM using the GMR effect because the MTJ structure makes use of the TMR effect. Consequently, the magnetic free layer and the magnetic pinned layer get closer and closer to each other, and thus the magnetization of the magnetic free layer is greatly affected by the magnetic pinned layer.

DISCLOSURE OF INVENTION

Technical Problem

The present invention a method for recording information in a magnetic recording element using a magnetic vortex that has low power consumption and simple and convenient use characteristics, can write and read information within a time interval of less than several nano seconds, and can highly integrate unit cells above several Giga bytes per square inches.

The present invention also provides a method for recording information in a magnetic recording element using a magnetic vortex that has low power consumption and simple and convenient use characteristics, can be switched on and off within a time interval of less than several nano seconds, and can highly integrate unit cells above several Giga bytes per square inches.

Technical Solution

According to an exemplary embodiment, a method for recording information in a magnetic recording element includes: preparing the magnetic recording element having a magnetic free layer in which a magnetic vortex is formed; switching a core orientation of a magnetic vortex formed in the magnetic free layer to an upward direction or downward direction from a top surface of the magnetic free layer by applying to the magnetic free layer a current or a magnetic field whose direction varies with time; and assigning "0" or "1" according to the core orientation of the magnetic vortex formed in the magnetic free layer.

According to another exemplary embodiment, a method for recording information in a magnetic random access memory includes: preparing the magnetic random access memory having an array of magnetic recording elements aligned in row and column, each of the magnetic recording elements including a magnetic free layer in which a magnetic vortex is formed, and plurality drive electrode pairs disposed to ohmic-contact the magnetic free layer, and each of the magnetic recording elements sharing the plurality drive electrode pairs with the adjacent magnetic recording element; switching a core orientation of a magnetic vortex formed in the magnetic free layer of the selected magnetic recording element to a desired direction, and constantly maintaining a core orientation of the magnetic vortex formed in the magnetic free layer provided in the remaining magnetic recording element by applying a voltage to the plurality drive electrode pairs of the magnetic recording element selected for recording information; and assigning "0" or "1" according to the core orientation of the magnetic vortex formed in the magnetic free layer provided in the magnetic recording element.

According to yet another exemplary embodiment, a method for recording information in a magnetic random access memory include: preparing the magnetic random access memory having an array of magnetic recording elements aligned in row and column, each of the magnetic recording elements including a magnetic free layer in which a magnetic vortex is formed, and a plurality drive electrodes formed to cross each other at least on or beneath the magnetic free layer, and each of the magnetic recording elements sharing the plurality drive electrodes with the adjacent magnetic recording element; switching a core orientation of a magnetic vortex formed in the magnetic free layer of the selected magnetic recording element to a desired direction, and constantly maintaining a core orientation of the magnetic vortex formed in the magnetic free layer provided in the remaining magnetic recording element by applying a current to the plurality drive electrodes of the magnetic recording element selected for recording information; and assigning "0" or "1" according to the direction of the core orientation of the magnetic vortex formed in the magnetic free layer provided in the magnetic recording element.

Advantageous Effects

According to the method for recording information in a magnetic recording element of the present invention, the core orientation of the magnetic vortex formed in the magnetic free layer of the magnetic recording element can be selectively switched by applying a current or magnetic field whose direction varies with time to the magnetic recording element, so that information can be easily and correctly recorded, lower power is consumed in recording information, and the switching for recording information can be performed very rapidly.

According to the method for recording information in a magnetic random access memory of the present invention, it is easy to select a magnetic recording element for recording information.

BRIEF DESCRIPTION OF DRAWINGS

Exemplary embodiments can be understood in more detail from the following description taken in conjunction with the accompanying drawings, in which:

FIG. 1 is a perspective view of a magnetic recording element used in a method for recording information in a magnetic recording element according to a preferred embodiment of the present invention;

FIG. 2 is a graph showing variation of magnetization state formed in a magnetic film according to the thickness and diameter of a magnetic film when the magnetic film is formed of a permalloy, has a magnetic anisotropy (Ku) of '0', and has a disk shape;

FIGS. 3 and 4 are schematic views showing magnetization direction of a magnetic film in which a magnetic vortex is formed;

FIG. 5 is a perspective view of a magnetic recording element used in a method for recording information according to another preferred embodiment of the present invention;

FIG. 6 is a flowchart showing a method for recording information in a magnetic recording element according to a preferred embodiment of the present invention;

FIGS. 7 through 10 are graphs showing the intensity of gyrotropic field according to the speed of a magnetic vortex core motion and the vortex-core magnetization profile along the line crossing the vortex core.

FIG. 11 is a schematic view showing an electrode configuration of a magnetic recording element in a method for recording of information in a magnetic recording element according to a preferred embodiment of the present invention;

FIG. 12 is a graph of voltage applied from the AC voltage source of FIG. 11;

FIGS. 13 through 15 are schematic views showing variation of a current flowing in the magnetic free layer over time when the AC voltage of FIG. 12 is applied;

FIGS. 16 and 17 are schematic views showing results of currents applied to the magnetic free layer when a pulse voltage having a Gaussian distribution is applied through drive electrodes in a method for recording information according to an embodiment of the present invention;

FIGS. 18 through 20 are schematic views showing results of currents applied to the magnetic free layer when since or cosine pulse voltages having the same frequency and a predetermined phase difference is applied through drive electrodes in a method for recording information according to an embodiment of the present invention;

FIGS. 21 and 22 are schematic views showing variation of a magnetic vortex core when a circularly polarized current is applied to a magnetic film whose magnetic vortex has an upward core orientation from a top surface of the magnetic film;

FIG. 23 is a graph showing rotation radius of a magnetic vortex core according to variation in the frequency of an applied current when a left circularly polarized current and a right circularly polarized current are applied to a magnetic film whose magnetic vortex has an upward core orientation from a top surface of the magnetic film;

FIG. 24 is a graph showing speed of a magnetic vortex core according to variation in the frequency of an applied current when a left circularly polarized current and a right circularly polarized current are applied to a magnetic film whose magnetic vortex has an upward core orientation from a top surface of the magnetic film;

FIGS. 25 and 26 are schematic views showing variation of a magnetic vortex core when a circularly polarized current is applied to a magnetic film whose magnetic vortex has an upward core orientation from a top surface of the magnetic film;

FIG. 27 is a graph showing rotation radius of a magnetic vortex core according to variation in the frequency of an applied current when a left circularly polarized current and a right circularly polarized current are applied to a magnetic film whose magnetic vortex has an upward core orientation from a top surface of the magnetic film;

FIG. 28 is a graph showing speed of a magnetic vortex core according to variation in the frequency of an applied current when a left circularly polarized current and a right circularly polarized current are applied to a magnetic film whose magnetic vortex has an upward core orientation from a top surface of the magnetic film;

FIG. 29 is a graph showing conditions of frequency and amplitude for switching the core orientation of a magnetic vortex formed in a magnetic free layer from a downward direction to an upward direction of a top surface;

FIGS. 30 through 32 are graphs showing conditions of frequency and amplitude for switching the core orientation of a magnetic vortex formed in a magnetic free layer from a downward direction to an upward direction of a top surface when a pulse current is applied to the magnetic free layer;

FIG. 33 is a perspective view of a magnetic random access memory used in a method for recording information in the magnetic random access memory according to a preferred embodiment of the present invention;

FIG. 34 is a perspective view of a magnetic random access memory used in a method for recording information in the magnetic random access memory according to another preferred embodiment of the present invention;

FIG. 35 is a flowchart showing a method for recording information in a magnetic random access memory according to a preferred embodiment of the present invention;

FIG. 36 is a schematic view showing selected magnetic recording elements and non-selected magnetic recording elements in a method for recording information in a magnetic random access memory according to the present invention; and FIG. 37 is a schematic view showing variation in the current density according to position on a magnetic film when a linearly polarized current is applied.

MODE FOR THE INVENTION

A method for recording information in a magnetic recording element and a method for recording information in a magnetic random access memory (MRAM) according to preferred embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIG. 1 is a perspective view of a magnetic recording element used in a method for recording information in a magnetic recording element according to an embodiment of the present invention.

Referring to FIG. 1, the magnetic recording element 100 according to an embodiment of the present invention includes a read electrode 110, a magnetic pinned layer 120, a dielectric layer 130, a magnetic free layer 140 and drive electrodes 150a, 150b, 151a and 151b.

The read electrode 110 is shaped in a plate extending in a direction, and is used for reading information stored in the magnetic recording element 100. The read electrode 110 is composed of a bilayer of titanium (Ti) and gold (Au).

The magnetic pinned layer 120 is formed on the read electrode 110 in the shape of a disk. The magnetic pinned layer 120 is formed of an iron (Fe)-nickel (Ni) alloy, which is a ferromagnetic material and is called 'permalloy'. The magnetic pinned layer 120 provides a magnetization, which is a reference for reading information recorded in the magnetic recording element. In order to provide the magnetization, a magnetic vortex or a magnetic single domain having a magnetization state arranged parallel with a top surface of the magnetic pinned layer 120 may be formed in the magnetic pinned layer 120. The magnetization state formed in the magnetic pinned layer 120 is determined by the shape of the magnetic pinned layer 120. The variation of the magnetization state formed in the magnetic film according to the shape of the magnetic film is shown in FIG. 2.

FIG. 2 is a graph showing the variation of the magnetization state formed in the magnetic film according to the thickness and diameter of the magnetic film when the magnetic film is formed of a permalloy, has a magnetic anisotropy (Ku) of '0', and has a disk shape.

As shown in FIG. 2, the magnetization state of the magnetic film having a disk shape is determined by the diameter and thickness of the magnetic film. In a magnetic film having the thickness and diameter corresponding to a region I of FIG. 2, a magnetic single domain having the magnetization state arranged parallel to a top surface of the magnetic film is formed. In a magnetic film having the thickness and diameter corresponding to a region III of FIG. 2, a magnetic single domain having the magnetization state arranged in a direction perpendicular to a top surface of the magnetic film is formed. In a magnetic film having the thickness and diameter corresponding to a region II of FIG. 2, a magnetic vortex is formed.

As described above, since the magnetic vortex or the magnetic single domain having the magnetization state arranged parallel to the top surface of the magnetic pinned layer 120 is formed, the magnetic pinned layer 120 has the thickness and diameter corresponding to the region I or II of FIG. 2.

The dielectric layer 130 is formed on the magnetic pinned layer 120 in the same shape as that of the magnetic pinned layer 120, i.e., in the shape of a disk. The dielectric layer 130 is formed between the magnetic pinned layer 120 and the magnetic free layer 130 so as to utilize a tunneling magnetoresistance (TMR) effect. Therefore, the dielectric layer 130 is formed of magnesium oxide (MgO) well showing the TMR effect. Also, to maximize the TMR effect, a cobalt (Co) thin film or cobalt (Co)-iron (Fe) alloy thin film (not shown) having a thickness of several nanometers may be formed between the magnetic pinned layer 120 and the dielectric layer 130 and between the magnetic free layer 140 and the dielectric layer 130.

The magnetic free layer 140 is formed on the dielectric layer 130 in the same shape as that of the dielectric layer 130, i.e., in the shape of a disk. Like the magnetic pinned layer 120, the magnetic free layer 140 is formed of a Fe—Ni alloy, which is a ferromagnetic material and is called 'permalloy'. The magnetic free layer 140 is formed so as to form a magnetic vortex therein. That is, the magnetic free layer 140 is formed so as to have the thickness and diameter corresponding to the region II of FIG. 2.

The magnetization states of the magnetic free layer 140 having the thickness and diameter corresponding to the region II of FIG. 2 and having a magnetic vortex formed therein are schematically shown in FIGS. 3 and 4. The magnetic vortex 310 has a magnetic vortex core 320a, 320b having a magnetization component perpendicular to the top surface of the magnetic free layer 140 at a core of the magnetic free layer 140. The magnetic vortex 310 also has a parallel magnetization 330, which is a magnetization component formed around the magnetic vortex core 320a, 320b and rotating in a direction parallel to the top surface of the magnetic free layer 140. At this time, the core orientation of the magnetic vortex 310 is an upward direction 320a from the top surface of the magnetic free layer 140 as shown in FIG. 3 or is a downward direction 320b from the top surface of the magnetic free layer 140 as shown in FIG. 4. The parallel magnetization 330 formed around the magnetic vortex core 320a, 320b forms a concentric circle centering on the magnetic vortex core 320a, 320b.

When the magnetic free layer 140 is formed by adjusting the thickness and diameter such that the magnetic vortex 310 is formed, it is possible to record information according to the core orientation of the magnetic vortex formed in the magnetic free layer 140. That is, it is possible to record information by defining as "1" cases in which the core orientation of the magnetic vortex is formed in an upward direction from the top surface of the magnetic free layer 140 and defining as "0" cases in which the core orientation of the magnetic vortex is formed in a downward direction from the top surface of the magnetic free layer 140.

The drive electrodes 150a, 150b, 151a and 151b are formed in the shape of a plate extending in a direction. Like the read electrode 110, the drive electrodes 150a, 150b, 151a and 151b may be composed of a bilayer of Ti and Au. Of the drive electrodes 150a, 150b, 151a and 151b, the drive electrodes 150a and 150b form one drive electrode pair and the drive electrodes 151a and 151b form another drive electrode pair. The drive electrodes 150a, 150b, 151a and 151b are formed at 90 intervals along a circumferential direction of the magnetic free layer 140. The drive electrodes 150a, 150b, 151a and 151b and the magnetic free layer 140 are disposed so as to form an ohmic contact. Therefore, when a voltage is applied to the drive electrode pairs 150 and 151, current flows through the magnetic free layer 140.

While the present embodiment shows and describes that the drive electrodes 150a, 150b, 151a and 151b are formed at 90 intervals along a circumferential direction of the magnetic free layer 140 as shown in FIG. 1, the present invention is not limited thereto. For example, the drive electrodes 150a, 150b, 151a and 151b may be formed at different angles along a circumferential direction of the magnetic free layer 140. Alternatively, the drive electrodes 150a, 150b, 151a and 151b may be arranged at side portions so as to form an ohmic contact with the magnetic free layer 140, or at least two drive electrode pairs may be formed so as to form an ohmic contact with the magnetic free layer 140. Also, three or more drive electrode pairs may be formed so as to form an ohmic contact with the magnetic free layer 140.

FIG. 5 is a perspective view of a magnetic recording element used in a method for recording information according to another embodiment of the present invention.

Referring to FIG. 5, the magnetic recording element 400 according to another embodiment of the present invention includes a read electrode 410, a magnetic pinned layer 420, a dielectric layer 430, a magnetic free layer 440 and drive electrodes 450 and 451.

The read electrode 410, the magnetic pinned layer 420, the dielectric layer 430, and the magnetic free layer 440 included in the magnetic recording element 400 of FIG. 5 correspond to the read electrode 110, the magnetic pinned layer 120, the dielectric layer 130 and the magnetic free layer 140 included in the magnetic recording element 100 shown in FIG. 1, respectively.

The drive electrodes 450 and 451 included in the magnetic recording element 400 of FIG. 5 may be formed in plurality such that they cross each other while covering a top center surface of the magnetic free layer 440. Preferably, the two drive electrodes 450 and 451 are disposed so as to cross each other at an angle of 90°. Like the drive electrodes 150a, 150b, 151a, 151b of FIG. 1, the drive electrodes 450 and 451 may be composed of a bilayer of Ti and Au. When a current is applied through the drive electrodes 450 and 451 formed thus, a magnetic field is applied to the magnetic free layer 440.

While the embodiment of FIG. 5 shows and describes that the drive electrodes 450 and 451 cross each other while covering a top center surface of the magnetic free layer 440, the present invention is not limited thereto. For example, one drive electrode may be disposed on the magnetic free layer 440 and the other drive electrode may be disposed beneath the magnetic free layer 440. In addition, the two drive electrodes 450 and 451 may be formed in a configuration to cross each other not at an angle of 90° but at a different angle other than 90° or may be disposed in a configuration to cover not the top center but a peripheral portion of the magnetic free layer 440. Also, while the embodiment of FIG. 5 shows and describes that the drive electrodes are two, the present invention is not limited thereto. For example, three or more drive electrodes may be formed on or beneath the magnetic free layer 140 in a configuration to cross each other.

FIG. 6 is a flowchart showing a method for recording information in a magnetic recording element according to a further embodiment of the present invention. While a method for recording information in a magnetic recording medium being implemented using the magnetic recording element shown in FIG. 1 is described below for reference, any magnetic recording element (ex. the magnetic recording element 400 of FIG. 5) that can have a magnetic film in which a magnetic vortex is formed, may be used.

Referring to FIG. 6, in operation S610, a magnetic recording element 100 having a magnetic free layer 140 in which a magnetic vortex is formed is prepared. As aforementioned, since information is recorded as "0" or "1" according to core orientation of the magnetic vortex formed magnetic free layer 140, the magnetic recording element 100 having the magnetic free layer 140 in which the magnetic vortex shown in FIG. 3 or 4 is formed is prepared. Accordingly, the magnetic free layer 140 should be designed so as to have the thickness and diameter corresponding to the region II of FIG. 2.

Next, in operation S620, a current whose direction varies with time is applied to the magnetic free layer 140 to switch the core orientation of the magnetic vortex formed in the magnetic free layer 140 to an upward direction or a downward direction from the top surface of the magnetic free layer 140.

As aforementioned, information of "0" or "1" is stored in the magnetic recording element 100 used in the present invention according to the core orientation of the magnetic vortex formed in the magnetic free layer 140. Therefore, in order to record new information in the magnetic recording element 100, it is necessary to switching the core orientation of the magnetic vortex formed in the magnetic free layer 140. The core orientation of the magnetic vortex formed in the magnetic free layer 140 can be switched by applying a predetermined current to the magnetic free layer 140.

When a current is applied to a magnetic film in which the magnetic vortex core is formed, the magnetic vortex core moves. As the magnetic vortex core moves, the structure of the magnetic vortex core is distorted. This is because a gyrotropic field caused by the movement of the magnetic vortex core is concentrated on a local region around the magnetic vortex core. This gyrotropic field increases as the speed of the magnetic vortex core motion increases, so that the distortion around the magnetic vortex core becomes serious, which is shown in FIGS. 7 through 10.

FIG. 7 illustrates a structure of magnetic vortex and a gyrotropic field when the speed of the magnetic vortex core motion is 0, FIG. 8 illustrates a structure of magnetic vortex and a gyrotropic field when the speed of the magnetic vortex core motion is 190 m/s, FIG. 9 illustrates a structure of magnetic vortex and a gyrotropic field when the speed of the magnetic vortex core motion is 284 m/s, and FIG. 10 illustrates a structure of magnetic vortex and a gyrotropic field when the speed of the magnetic vortex core motion is 357 m/s. In FIGS. 7 through 10, the x-axis indicates the size of the magnetic film and the diameter of the used magnetic film is 300 nm. In FIGS. 7 through 10, the value '0' corresponds to a center of the magnetic film and the value '±150' indicates both ends of the magnetic film. In FIGS. 7 through 10, the left scale of the y-axis indicates a ratio ($M_z/M_s$) of the intensity of perpendicular magnetization direction component ($M_z$) of magnetic vortex core over the intensity of saturated perpendicular magnetization component ($M_s$), and the right scale of the y-axis indicates the intensity of the gyrotropic field.

The curves indicated by reference numerals 710a of FIG. 7, 710b of FIG. 8, 710c of FIG. 9 and 710d of FIG. 10 indicate components of perpendicular direction in the magnetic vortex structures. The curves indicated by reference numerals 720a of FIG. 7, 720b of FIG. 8, 720c of FIG. 9 and 720d of FIG. 10 indicate gyrotropic fields, respectively. As shown in FIG. 7, when the speed of the magnetic vortex is 0, the gyrotropic field is near 0. However, as the speed of the magnetic vortex increases, the intensity of the gyrotropic fields 720b, 720c and 720d also increases as shown in FIGS. 8 through 10.

Accordingly, when the magnetic vortex is in a stop state, the magnetic vortex structure 710a is formed around a core of the magnetic film as shown in FIG. 7, and then when the magnetic vortex starts to move, the magnetic vortex structure 710b is distorted due to the gyrotropic field 720b as shown in FIG. 8. As the speed of the magnetic vortex increases, there appears the magnetic vortex structure 720c having the $M_z$ component opposite to the original core orientation of the magnetic vortex as shown in FIG. 8. As the speed of the magnetic vortex further increases, there appears the magnetic vortex structure 720d in which the $M_z$ component of the magnetic vortex in an opposite direction increases gradually.

When the speed of the magnetic vortex increases gradually so that the gyrotropic field reaches a critical value on a local area, the distortion of the magnetic vortex structure around the magnetic vortex core is maximized so that a vortex-antivortex pair having a core orientation opposite to the perpendicular magnetization direction of the original core orientation of the magnetic vortex is generated. The generated antivortex meets with the original magnetic vortex and annihilates, so that only a newly created magnetic vortex remains. Since the newly created magnetic vortex has opposite core orientation to that of the original magnetic vortex core, a switching in the core orientation of the magnetic vortex occurs.

As a result, when the vortex-antivortex pair is generated, the core orientation of the magnetic vortex is switched. In order for the vortex-antivortex pair to be generated, the value of the gyrotropic field formed on a local area should reach the critical value. Then, since the value of the gyrotropic field is proportional to the speed of the magnetic vortex core motion, the critical value of the gyrotropic field causing the switching of the core orientation of the magnetic vortex corresponds to the critical speed of the magnetic vortex core. Accordingly, in order to switch the core orientation of the magnetic vortex, a predetermined current should be applied to the magnetic film in which the magnetic vortex is formed, thereby increasing the speed of the magnetic vortex core motion above the critical speed.

There are various methods for increasing the speed of the magnetic vortex core motion so as to switch the core orientation of the magnetic vortex. For example, one is a method to apply to the magnetic free layer 140 a magnetic field antiparallel to the core orientation of the magnetic vortex formed in the magnetic free layer 140, i.e., a magnetic field having a direction perpendicular to the magnetic free layer. Another is a method to apply a current parallel to the top surface of the magnetic free layer 140 and having a constant frequency in one direction, i.e., a linear-polarized current to the magnetic free layer 140, which can increase the speed of the magnetic vortex core motion above the critical speed.

However, in order to switch the core orientation of the magnetic vortex formed in the magnetic free layer 140 using the above methods, a relatively large current should be applied. Accordingly, in the case of using the above method, in order to record information in the magnetic recording element 100, a lot of power consumption occurs. Also, in the case of using the above method, the core orientation of the magnetic vortex is switched from a current direction to an opposite direction regardless of the core orientation of the magnetic vortex formed in the magnetic free layer 140. Accordingly, when it is intended to form the core orientation of the magnetic vortex formed in the magnetic free layer 140 in a specific direction, it should be preceded to grasp the core orientation of the magnetic vortex formed in the magnetic free layer 140 at the present prior to applying a current to the magnetic free layer 140.

To address these problems, a current whose direction varies with time should be applied to record information in the magnetic recording element 100 like in the present invention. Preferably, a current whose direction is successively changed over time is applied. At this time, the direction of the applied current may be successively changed on a single plane, which is parallel to the top surface of the magnetic free layer 140. More preferably, a current whose direction successively varies with time at a constant period or whose direction successively varies with time and intensity is constant is applied. Alternatively, a pulse current whose direction varies with time may be applied.

In the case where the magnetic free layer 140 is formed in the shape of an elliptical plate or a rectangular plate, an elliptically polarized current rotating along a plane parallel to the top surface of the magnetic free layer 140 is applied. And in the case where the magnetic free layer 140 is formed in the shape of a disc or square plate, a circularly polarized current rotating along a plane parallel to the top surface of the magnetic free layer 140 is applied.

The elliptically polarized current indicates a current whose magnitude over time and direction trace are elliptical, and a circularly polarized current is a special form of the elliptically polarized current and indicates a current whose the intensity over time and the direction trace are circular. The intensity of the circularly polarized current is always the same regardless of variation of time. The elliptically polarized current or circularly polarized current has a constant rotational period, and the elliptically polarized current or circularly polarized current applied to the magnetic free layer 140 from such a fact has a constant frequency.

A process for applying the elliptically polarized current or circularly polarized current is shown in FIGS. 10 and 11.

FIG. 11 is a schematic view showing an electrode configuration of a magnetic recording element in a method for recording of information in a magnetic recording element according to a preferred embodiment of the present invention, and FIG. 12 is a graph of voltage applied from the AC voltage source of FIG. 11.

Referring to FIGS. 11 and 12, the magnetic recording element has an electrode configuration shown in FIGS. 1 and 12 so as to apply a current to the magnetic free layer 140 thereof. That is, four electrodes 150a, 150b, 150c and 150d in ohmic contact with the magnetic free layer 140 are disposed at 90 intervals in a circumferential direction of the top surface of the magnetic free layer 140. Of four electrodes 150a, 150b, 150c and 150d, one pair of two electrodes facing each other and indicated by reference numerals 150a and 150b of FIG. 11 and another pair of two electrodes indicated by reference numerals 151a and 151b of FIG. 11 are connected to the AC voltage source. For the convenience of description, two electrodes 150a and 150b of FIG. 11 are called a first drive electrode pair and two electrodes 151a and 151b of FIG. 11 are called a second drive electrode pair.

When sine- or cosine-wave voltages having the same frequency and a predetermined phase difference are applied to the first drive electrode pair 150a and 150b and the second drive electrode pair 151a and 151b, an elliptically polarized current flows through the magnetic free layer 140. For example, when sine- or cosine-wave AC voltages having the same frequency and a phase difference of 90° and having different amplitudes or sine- or cosine-wave voltages having the same frequency and amplitude and having a phase difference other than 90° are applied to the first drive electrode pair 150a and 150b and the second drive electrode pair 151a and 151b, an elliptically polarized current flows through the magnetic free layer 140.

When sine- or cosine-wave AC voltages with the same frequency and amplitude and with a phase difference of 90° are applied to the first drive electrode pair 150a and 150b and the second drive electrode pair 151a and 151b, a circularly polarized current flows through the magnetic free layer 140. One example for applying a circularly polarized current to the magnetic free layer 140 is shown in FIG. 12. That is, a sine wave AC voltage indicated by reference numeral 1020 of FIG. 12 is applied to the first drive electrode pair 150a and 150b, and a cosine wave AC voltage indicated by reference numeral 1010 of FIG. 12 is applied to the second drive electrode pair 151a and 151b. As shown in FIG. 12, the sine wave AC voltage indicated by reference numeral 1020 and the cosine wave AC voltage indicated by reference numeral 1010 have the same frequency and amplitude and have a phase difference of 90°.

When the AC voltage shown in FIG. 12 is applied to the first drive electrode pair 150a and 150b and the second drive electrode pair 151a and 151b, respectively, variations of a current flowing in the magnetic free layer over time are shown in FIGS. 13 through 15.

FIG. 13 is schematic views when a potential difference of +0.2 V is applied to the second drive electrode pair 151a and 151b and a potential difference of 0 V is applied to the first drive electrode pair 150a and 150b. In order to apply the potential difference of +0.2 V to the second drive electrode pair 151a and 151b, +0.1 V is applied to the left electrode 151b of the second drive electrode pair 151a and 151b and 0.1 V is applied to the right electrode 151a. The direction of arrows shown in FIG. 13 indicates directions of a current at those portions. At this time, since any voltage is not applied through the first drive electrode pair 150a and 150b, the direction of a total current flowing through the magnetic free layer 140 is from the left to the right, and a direction perpendicular to the direction of the total current flowing is indicated by reference numeral 1110, which is defined as '0°'.

FIG. 14 is schematic views when a potential difference of +0.152 V is applied to the second drive electrode pair 151a and 151b and a potential difference of +0.1 V is applied to the first drive electrode pair 150a and 150b as time elapses. In order to apply the potential difference of +0.152 V to the second drive electrode pair 151a and 151b, +0.086 V is applied to the left electrode 151b of the second drive electrode pair 151a and 151b and −0.086 V is applied to the right electrode 151a. In order to apply the potential difference of +0.1 V to the first drive electrode pair 150a and 150b, +0.05 V is applied to the upper electrode 150a of the first drive electrode pair 150a and 150b and −0.05 V is applied to the lower electrode 150b. At this time, a direction perpendicular to the direction of a total current flowing through the magnetic free layer 140 is indicated by reference numeral 1120, which corresponds to a clockwise progression by 30° compared with the case of FIG. 13.

FIG. 15 is schematic views when a potential difference of +0.142 V is applied to both the first drive electrode pair 150a and 150b and the second drive electrode pair 151a and 151b over a further elapse of time. In order to apply the potential difference of +0.142 V to the first drive electrode pair 150a and 150b, +0.071 V is applied to the upper electrode 150a of the first drive electrode pair 150a and 150b and −0.071 V is applied to the lower electrode 150b. In order to apply a potential difference of +0.142 V, +0.071 V is applied to the left electrode 151b of the second drive electrode pair 151a and 151b and −0.071 V is applied to the right electrode 151a. At this time, a direction perpendicular to the direction of a total current flowing through the magnetic free layer 140 is indicated by reference numeral 1130, which corresponds to a clockwise progression by 45° compared with the case of FIG. 13.

With further elapse of time, the direction of the total current flowing rotates clockwise. At this time, since the intensity of the current is not changed, a circularly polarized current is generated. At this time, the frequency of the circularly polarized current is the same as that of the applied voltage. Thus, a circularly polarized current rotating clockwise at a constant frequency in a plane parallel to the top surface of the magnetic free layer 140 is called a right circularly polarized (RCP) current. On the contrary, when a cosine wave voltage is applied to the first drive electrode pair 150a and 150b and a sine wave voltage is applied to the second drive electrode pair 151a and 151b, it is possible to apply a circularly polarized current rotating counterclockwise to the magnetic free layer 140. Thus, a circularly polarized current rotating counterclockwise at a constant frequency in a plane parallel to the top surface of the magnetic free layer 140 is called a left circularly polarized (LCP) current.

It is possible to apply a circularly polarized current through the aforementioned method. Instead of continuing to apply a voltage, it is also possible to apply a pulse voltage. For example, a pulse voltage having a Gaussian distribution may be applied at a predetermined time difference to the first drive electrode pair 150a and 150b and the second drive electrode pair 151a and 151b. It is noted that the pulse voltage applied to the first drive electrode pair 150a and 150b and the second drive electrode pair 151a and 151b should be applied together for a predetermined time. If there no exists time applied together, a current whose direction is not changed over time may be applied.

An example in which a current whose direction varies with time is applied to the magnetic free layer 140 by applying a pulse voltage having a Gaussian distribution to the first drive electrode pair 150a and 150b and the second drive electrode pair 151a and 151b is shown in FIGS. 16 and 17.

FIG. 16 is a schematic view of when a pulse voltage having a Gaussian distribution indicated by reference numeral 4410a is applied to the first drive electrode pair 150a and 150b and a pulse voltage having a Gaussian distribution indicated by reference numeral 4420a is applied to the second drive electrode pair 151a and 151b. When voltages are applied as aforementioned, a current having a configuration rotating counterclockwise is applied to the magnetic free layer 140 as shown in the right side of FIG. 16. FIG. 17 is a schematic view of when a pulse voltage having a Gaussian distribution indicated by reference numeral 4410*b* is applied to the first drive electrode pair 150*a* and 150*b* and a pulse voltage having a Gaussian distribution indicated by reference numeral 4420*b* is applied to the second drive electrode pair 151*a* and 151*b*. When voltages are applied as aforementioned, a current having a configuration rotating clockwise is applied to the magnetic free layer 140 as shown in the right side of FIG. 17.

At this time, the magnitude and direction trace of current applied to the magnetic free layer 140 over time approach a circular shape when the applied pulse voltages having the same Gaussian distributions. That is, when an average value and a full width at half maximum (FWHM) of the two Gaussian distributions are the same, the magnitude and direction trace of current applied to the magnetic free layer 140 over time approach a circular shape. Also, when voltages having two Gaussian distributions are applied at time intervals 0.6671 times greater than FWHM, the magnitude and direction trace of current applied to the magnetic free layer 140 over time approach a circular shape. It is possible to apply a pulse voltage having a Gaussian distribution matched with the shape of the magnetic free layer 140 using the above characteristics. For example, in the case where the magnetic free layer 140 is formed in the shape of a disk, it is preferable that a current having a trace close to a circular shape be applied to the magnetic free layer 140. Therefore, two pulse voltages having the same Gaussian distributions (the same average value and FWHM) are applied at time intervals of the 0.6671 times FWHM.

Sine pulse or cosine pulse voltages having the same frequency and a phase difference may be applied to the first drive electrode pair 150*a* and 150*b* and the second drive electrode pair 151*a* and 151*b*. The voltages being applied as above results in an elliptically polarized current or a circularly polarized current being applied for a predetermined time. One example for applying voltages as above is shown in FIGS. 18 to 20.

FIG. 18 is a schematic view of when a sine pulse having a half period and indicated by reference numeral 1210*a* is applied to the second drive electrode pair 151*a* and 151*b* and a sine pulse having a half period and indicated by reference numeral 1220*a* is applied to the first drive electrode pair 150*a* and 150*b*. When voltages are applied as in the description of FIG. 18, a circularly polarized current rotating counterclockwise by 90 degrees is applied to the magnetic free layer 140 as shown in the right side of FIG. 18. FIG. 19 is a schematic view of when a sine pulse having one period and indicated by reference numeral 1210*b* is applied to the second drive electrode pair 151*a* and 151*b* and a sine pulse having one period and indicated by reference numeral 1220*b* is applied to the first drive electrode pair 150*a* and 150*b*. When voltages are applied as in the description of FIG. 19, a circularly polarized current rotating counterclockwise by 270 degrees is applied to the magnetic free layer 140 as shown in the right side of FIG. 19. FIG. 20 is a schematic view of when a sine pulse having one and half period and indicated by reference numeral 1210*c* is applied to the second drive electrode pair 151*a* and 151*b* and a sine pulse having one and half period and indicated by reference numeral 1220*c* is applied to the first drive electrode pair 150*a* and 150*b*. When voltages are applied as in the description of FIG. 20, a circularly polarized current rotating counterclockwise by 450 degrees is applied to the magnetic free layer 140 as shown in the right side of FIG. 20.

While the above embodiments show and describe a magnetic recording element having two pairs of drive electrodes in a way to apply to the magnetic free layer 140 a current whose direction varies with time, the present invention is not limited thereto but can be similarly applied to a magnetic recording element having three or more pairs of drive electrodes. However, it is noted that frequencies of applied voltages in all the pairs of drive electrodes are preferably the same, the drive electrodes are formed along a circumference of the magnetic free layer 140 so as to apply a circularly polarized current, and a voltage having a constant phase difference should be applied to each drive electrode pair.

When an elliptically polarized current or a circularly polarized current is applied by the aforementioned method, although the core orientation of the magnetic vortex formed in the magnetic free layer 140 is not known, it is possible to form the core orientation of the magnetic vortex formed in the magnetic free layer 140 in a desired direction. This will be possible by using an LCP current and an RCP current.

FIGS. 21 and 22 are schematic views showing variations of a magnetic vortex core when a circularly polarized current is applied to a magnetic film in which the magnetic vortex core is formed upward from the top surface thereof. Specifically, FIG. 21 is a case where an LCP current is applied, and FIG. 22 is a case where an RCP current is applied. In respective cases, frequencies and magnitudes of applied currents are the same.

As shown in FIGS. 21 and 22, it can be seen that the case where the LCP current is applied to the magnetic film in which the magnetic vortex core is formed upward from the top surface thereof has a rotation radius much greater than the case where the RCP current is applied. At this time, a rotation radius of the magnetic vortex core over variation in frequency is shown in FIG. 23. The diameter of the used magnetic film is 300 nm. The x-axis corresponds to values normalizing a frequency of an applied current with an eigenfrequency of the magnetic vortex core formed in the magnetic film. The eigenfrequency ($v_0$) of the magnetic vortex is defined as the following Equation:

$$v_0 = \frac{1}{4\pi}\gamma M_s \frac{\xi^2}{\chi(0)} \qquad \text{(Equation 1)}$$

where $M_S$ is a saturation magnetization of the magnetic film, $\chi(0)$ is an initial susceptibility, $\gamma$ is a gyromagnetic ratio, and $\xi$ is a proportional constant. Since the gyromagnetic ratio and the proportional constant are constant values regardless of the forming material and shape of the magnetic film, the eigenfrequency of the magnetic vortex is inversely proportional to the initial susceptibility of the magnetic film in which the magnetic vortex is formed and is proportional to the square of saturation magnetization. The initial susceptibility is determined by the shape of the magnetic film, and the saturation magnetization is determined by the forming material of the magnetic film.

The curve indicated by reference numeral 1410 of FIG. 23 corresponds to a case where an LCP current having a magnitude of 0.8 mA is applied, and the curve indicated by reference numeral 1420 of FIG. 23 corresponds to a case where an RCP current having a magnitude of 0.8 mA is applied. As shown in FIG. 23, the case where the LCP current is applied to the magnetic film is larger in rotation radius of the magnetic vortex core than the case where the RCP current is applied. In particular, such a difference is large when the same frequency as the eigenfrequency of the magnetic vortex is applied.

The speed of the magnetic vortex core according to variation of frequency is shown in FIG. 24. Like in FIG. 23, the x-axis corresponds to values normalizing a frequency of an applied current with an eigenfrequency of the magnetic vortex core formed in the magnetic film. The curve indicated by reference numeral 1510 of FIG. 24 corresponds to a case where an LCP current having a magnitude of 0.8 mA is applied, and the curve indicated by reference numeral 1520 of FIG. 24 corresponds to a case where an RCP current having a magnitude of 0.8 mA is applied. In the graph of FIG. 24, there is also shown a critical speed at which the magnetic vortex core is switched. As shown in FIG. 24, in all frequencies, the case where an LCP current is applied is larger in the speed of the magnetic vortex core than the case where an RCP current is applied. In particular, such a difference is large when the same frequency as the eigenfrequency of the magnetic vortex is applied. Since currents having the same frequency are applied, the case (1510 of FIGS. 21 and 24) having a relatively large rotation radius is larger in the speed of the magnetic vortex core than the case having a relatively small rotation radius (1520 of FIGS. 22 and 24).

In the case 1520 where the RCP current having a magnitude of 0.8 mA is applied, there no exists a circumstance where the speed of the magnetic vortex core is above the critical speed within all frequency range. This result means that when the core orientation of the magnetic vortex is toward an upward direction from the top surface of the magnetic film, applying the RCP current cannot switch the core orientation of the magnetic vortex. In the meanwhile, in the case 1510 where the LCP current having a magnitude of 0.8 mA is applied, the speed of the magnetic vortex core becomes above the critical speed at a frequency around the eigenfrequency. Accordingly, when the LCP current having the eigenfrequency is applied, the core orientation of the magnetic vortex formed upward from the top surface of the magnetic film can be switched to a downward direction.

However, result achieved in the case where the core orientation of the magnetic vortex is formed in a downward direction from the top surface of the magnetic film is opposite to the above result, which is shown in FIGS. 25 to 28.

FIG. 25 is a schematic view showing variation of the magnetic vortex core when an LCP current is applied, FIG. 26 is a schematic view showing variation of the magnetic vortex core when an RCP current is applied, FIG. 27 illustrates rotation radius of the magnetic vortex core according to variation of frequency, and FIG. 28 illustrates speed of the magnetic vortex core according to variation of frequency. The curve indicated by reference numeral 1710 of FIGS. 27 and 1810 of FIG. 28 corresponds to a case of when an RCP current having a magnitude of 0.8 mA is applied, and the curve indicated by reference numeral 1720 of FIG. 27 and 1820 of FIG. 28 corresponds to a case of when an LCP current having a magnitude of 0.8 mA is applied.

As shown in FIGS. 25 and 26, contrary to the case where the core orientation of the magnetic vortex is formed in an upward direction from the top surface of the magnetic film, the case (FIG. 25) where the LCP current is applied to the magnetic film has much smaller rotation radius than the case (FIG. 26) where the RCP current is applied. In all frequencies, the case (1710) where the LCP current is applied has a smaller rotation radius than the case (1720) where the RCP current is applied.

Like in FIG. 23, such a difference in the rotation radius is particularly large when a current having a frequency around the magnetic vortex is applied. The speed of the magnetic vortex core shows a similar tendency to the rotation radius of the magnetic vortex core (FIG. 28). That is, the magnetic vortex in the case (1810) where the RCP current is applied moves more rapidly than that in the case (1820) where the LCP current is applied. In the case (1820) where the LCP current is applied, it is impossible to move the magnetic vortex core above the critical speed. As a result, in the case where the core orientation of the magnetic vortex is formed in a downward direction from the top surface of the magnetic film, the LCP current cannot switch the core orientation of the magnetic vortex. Therefore, the RCP current should be applied so as to switch the core orientation of the magnetic vortex.

Accordingly, although there no exists information on the core orientation of the magnetic vortex formed in the magnetic free layer 140, it is possible to form the core orientation of the magnetic vortex in a desired direction by using a circularly polarized current.

For this purpose, when it is intended to form the core orientation of the magnetic vortex in an upward direction from the top surface of the magnetic film, the RCP current is applied to the magnetic free layer 140. This is because the RCP current can easily switch the core orientation of the magnetic vortex formed downward from the top surface of the magnetic free layer 140 to an upward direction, but has a difficulty in switching the core orientation of the magnetic vortex formed in an upward direction from the top surface of the magnetic free layer 140 to a downward direction, as aforementioned. The core orientation of the magnetic vortex originally formed in a downward direction from the top surface of the magnetic free layer 140 is switched to an upward direction, and the core orientation of the magnetic vortex originally formed in an upward direction from the top surface of the magnetic free layer 140 is not switched but is maintained. Accordingly, it is possible to form the core orientation of the magnetic vortex in an upward direction from the top surface of the magnetic free layer 140 by applying the RCP current regardless of the core orientation of the magnetic vortex formed in the magnetic free layer 140.

On the contrary, when it is intended to form the core orientation of the magnetic vortex in a downward from the top surface of the magnetic film, the LCP current is applied to the magnetic free layer 140. This corresponds to a contrary reason to the above reason. That is, the core orientation of the magnetic vortex originally formed in an upward from the top surface of the magnetic free layer 140 is switched to a downward direction and the core orientation of the magnetic vortex originally formed in a downward from the top surface of the magnetic free layer 140 is not switched but is maintained. Accordingly, it is possible to form the core orientation of the magnetic vortex in a downward direction from the top surface of the magnetic free layer 140 by applying the LCP current regardless of the core orientation of the magnetic vortex formed in the magnetic free layer 140.

In order to compare a circularly polarized current with a linearly polarized current, an RCP current, an LCP current and a linearly polarized current are applied to the magnetic free layer 140, and a condition for switching the core orientation of the magnetic vortex formed in the magnetic free layer 140 is shown in FIG. 29. FIG. 29 is a graph showing conditions of frequency and amplitude for switching the core orientation of the magnetic vortex formed in the magnetic free layer 140 from a downward direction of the top surface of the magnetic free layer 140 to an upward direction. The x-axis of FIG. 29 indicates a ratio of frequency (v) of an applied current over the eigenfrequency ($v_o$) of the magnetic vortex formed in the magnetic free layer 140, and the y-axis indicates a magnitude (I) of the applied current.

Referring to FIG. 29, the curve indicated by reference numeral 1910 corresponds to a case where the RCP current is applied to the magnetic free layer 140, the curve indicated by reference numeral 1920 corresponds to a case where the LCP current is applied to the magnetic free layer 140, and the curve indicated by reference numeral 1930 corresponds to a case where the linearly polarized current is applied to the magnetic free layer 140, respectively. In conditions corresponding to the respective curves 1910, 1920 and 1930, i.e., when a circularly polarized or linearly polarized current which has a constant frequency and is equal to or greater than the magnitudes of currents corresponding to the respective curves is applied, the core orientation of the magnetic vortex formed in the magnetic free layer 140 is switched.

As shown in FIG. 29, in the case (1910) where the RCP current is applied, the core orientation of the magnetic vortex formed in the magnetic free layer 140 can be switched from a downward direction of the top surface of the magnetic free layer 140 to an upward direction by applying the smallest current. In particular, in a case where a current having the same frequency as the eigenfrequency ($v_0$) of the magnetic vortex is applied, the smallest current can be applied to switch the core orientation of the magnetic vortex formed in the magnetic free layer 140.

In the case (1910) where the RCP current having the same frequency as the eigenfrequency of the magnetic vortex is applied, the core orientation of the magnetic vortex formed in the magnetic free layer 140 can be switched from a downward direction of the top surface of the magnetic free layer 140 to an upward direction even with a current of about 0.8 mA. However, in the case (1930) where the linearly polarized current is applied, the core orientation of the magnetic vortex formed in the magnetic free layer 140 can be switched from a downward direction of the top surface of the magnetic free layer 140 to an upward direction with a current of about 1.6 mA. That is, compared with the case (1930) where the linearly polarized current is applied, the case (1910) where the RCP current is applied can switch the core orientation of the magnetic vortex formed in the magnetic free layer 140 from the downward direction to the upward direction of the top surface of the magnetic free layer 140 with a current corresponding to half of the current in the case (1930). The magnitude of current for switching the core orientation of the magnetic vortex from the downward direction to the upward direction from the top surface of the magnetic free layer 140 has an eight-fold difference from the case (1910) where the RCP current is applied to the case (1920) where the LCP current is applied.

Contrary to the above condition, a drawing showing a condition that the core orientation of the magnetic vortex formed in the magnetic free layer 140 is switched from the upward direction of the top surface of the magnetic free layer 140 to the downward direction is also similar to FIG. 29. However, it is noted that a case where the LCP current is applied corresponds to the curve indicated by reference numeral 1910 of FIG. 29, a case where the RCP current is applied corresponds to the curve indicated by reference numeral 1920 of FIG. 29, and a case where the linearly polarized current is applied corresponds to the curve indicated by reference numeral 1930 of FIG. 29. Comparing these circumstances with those of FIG. 29, the LCP current should be applied so as to switch the core orientation of the magnetic vortex formed in the magnetic free layer 140 from the upward direction of the top surface of the magnetic free layer 140 to the downward direction with the smallest current.

Through the drawings showing the conditions of frequency and amplitude for switching the core orientation of the magnetic vortex, conditions for switching the core orientation of the magnetic vortex formed in the magnetic free layer 140 by applying a smaller current can be understood, and power consumption can be saved through such understanding.

While the above embodiments show and describe that a circularly polarized current is used, a current constantly rotating in one direction, for example, an elliptically polarized current shows a similar result.

Conditions of frequency and amplitude for switching the core orientation of the magnetic vortex formed in the magnetic free layer 140 from the downward direction of the top surface of the magnetic free layer 140 to the upward direction by applying a pulse current to the magnetic free layer 140 are shown in FIGS. 30 through 32. The magnetic free layer 140 used in FIGS. 30 through 32 is shaped in a disk having a radius of 150 nm and a thickness of 20 nm.

FIG. 30 is a graph of when a pulse corresponding to one period of a circularly polarized current is applied, FIG. 31 is a graph of when a pulse corresponding to half a period of a circularly polarized current is applied, and FIG. 32 is a graph of when a pulse having a Gaussian distribution is applied. In FIGS. 30 and 31, the x-axis indicates a ratio of frequency (v) of an applied current over the eigenfrequency ($v_0$ of the magnetic vortex formed in the magnetic free layer 140, and the y-axis indicates the magnitude (I) of an applied current. In FIG. 32, the x-axis indicates a full width at half maximum ($t_{FWHM}$) and the y-axis indicates the magnitude (I) of an applied current.

Referring to FIG. 30, the graph indicated by reference numeral 4210 of FIG. 30 is a case where a sine pulse voltage having half a period is applied through the drive electrodes 150*a*, 150*b*, 151*a* and 151*b* and the voltage applied through the second drive electrodes 151*a* and 151*b* is delayed by ¼ period such that a current rotating clockwise is applied to the magnetic free layer 140. The graph indicated by reference numeral 4220 of FIG. 30 corresponds to is a case where a sine pulse voltage having half a period is applied through the drive electrodes 150*a*, 150*b*, 151*a* and 151*b* and the voltage applied through the first drive electrodes 150*a* and 150*b* is delayed by ¼ period such that a current rotating counterclockwise is applied to the magnetic free layer 140. The graph indicated by reference numeral 4230 of FIG. 30 corresponds to a case where a sine pulse voltage having half a period is applied through only the first drive electrodes 150*a* and 150*b*.

In the case of reference numeral 4210, the type of current applied to the magnetic free layer 140 corresponds to some of the RCP current as aforementioned, in the case of reference numeral 4220, the type of current applied to the magnetic free layer 140 corresponds to some of the LCP current as aforementioned, and in the case of reference numeral 4230, the type of current applied to the magnetic free layer 140 corresponds to some of the linearly polarized current.

Accordingly, the conditions on frequency and amplitude for switching the core orientation of the magnetic vortex formed in the magnetic free layer 140 from the downward direction of the top surface to the upward direction of the top surface are similar to those in FIG. 29 as a whole. That is, the case of reference numeral 4210 can switch the core orientation of the magnetic vortex formed in the magnetic free layer 140 from the downward direction of the top surface to the upward direction of the top surface with the smallest current, while the case of reference numeral 4220 can switch the core orientation of the magnetic vortex formed in the magnetic free layer 140 from the downward direction of the top surface to the upward direction of the top surface with the largest current. The case (4230) of the linearly polarized current the case of reference numeral 4210 can switch the core orientation of the magnetic vortex formed in the magnetic free layer 140 from the downward direction of the top surface to the upward direction of the top surface with a middle current between the current corresponding to the case indicated by reference numeral 4210 and the current corresponding to the case indicated by reference numeral 4220. However, it is noted that not the eigenfrequency ($v_0$) of the magnetic vortex core but a frequency that has a minimum value somewhat smaller than the eigenfrequency and can switch the core orientation of the magnetic vortex formed in the magnetic free layer 140 from the downward direction of the top surface to the upward direction of the top surface is formed. Also, since the pulse voltage is applied, a voltage greater than when a voltage having a continuous form is applied should be applied so as to switch the core orientation of the magnetic vortex formed in the magnetic free layer 140. Accordingly, the switching will be possible when a larger current is applied.

Referring to FIG. 31, the graph indicated by reference numeral 4310 of FIG. 31 is a case where a sine pulse voltage having one period is applied through the drive electrodes 150*a*, 150*b*, 151*a* and 151*b* and the voltage applied through the second drive electrodes 151*a* and 151*b* is delayed by ¼ period such that a current rotating clockwise is applied to the magnetic free layer 140. The graph indicated by reference numeral 4320 of FIG. 31 corresponds to a case where a sine pulse voltage having one period is applied through the drive electrodes 150*a*, 150*b*, 151*a* and 151*b* and the voltage applied through the first drive electrodes 150*a* and 150*b* is delayed by ¼ period such that a current rotating counterclockwise is applied to the magnetic free layer 140. The graph indicated by reference numeral 4330 of FIG. 31 corresponds to a case where a sine pulse voltage having half a period is applied through only the first drive electrodes 150*a* and 150*b*.

Since the pulse voltage is applied in the case shown in FIG. 31, the resultant condition graph shown in of FIG. 31 is similar to that shown in FIG. 30. That is, the case indicated by reference numeral 4310 and rotating clockwise can switch the core orientation of the magnetic vortex formed in the magnetic free layer 140 from the downward direction of the top surface to the upward direction of the top surface with the smallest current. However, it is noted that in this case, since a current much close to the circularly polarized current is applied to the magnetic free layer 140 compared with the case applying the sine pulse voltage having half a period, its magnitude becomes minimum at a frequency much close to the eigenfrequency. Also, the magnitude of current switching the magnetic vortex core orientation is somewhat smaller than the case (FIG. 30) where the sine pulse voltage having half a period is applied, resulting the graph of the vortex core switching condition close to that in FIG. 29 as a whole.

Resultantly, when the pulse voltage is applied for a long time, the core orientation of the magnetic vortex formed in the magnetic free layer 140 can be switched by applying a small current, but a switching time increases. In consideration of this fact, it is possible to realize an optimum condition through a simulation.

Referring to FIG. 32, the graph indicated by reference numeral 4510 of FIG. 32 corresponds to a case where a pulse voltage having a Gaussian distribution is applied through the drive electrodes 150*a*, 150*b*, 151*a* and 151*b* and the voltage applied through the second drive electrodes 151*a* and 151*b* is delayed by a time interval of 0.6671 times greater than FWHM such that a current 4515 rotating clockwise is applied to the magnetic free layer 140. The graph indicated by reference numeral 4520 of FIG. 32 corresponds to a case where a pulse voltage having a Gaussian distribution is applied through the drive electrodes 150*a*, 150*b*, 151*a* and 151*b* and the voltage applied through the first drive electrodes 150*a* and 150*b* is delayed by a time interval of 0.6671 times greater than FWHM such that a current 4525 rotating counterclockwise is applied to the magnetic free layer 140. The graph indicated by reference numeral 4530 of FIG. 32 corresponds to a case where a pulse voltage having a linearly polarized Gaussian distribution is applied through only the first drive electrodes 150*a* and 150*b*.

Since the shape of the magnetic free layer 140 used in FIG. 32 is a circle, two pulses applied in reference numerals 4510 and 4520 are the same and are applied at a time interval of 0.6671 times FWHM as aforementioned. This is because the current under the above conditions is the closest to a circle, power consumption is minimized and a difference between currents in the respective cases is apparent. Like in FIGS. 30 and 31, in the case of applying the pulse voltage having a Gaussian distribution, the cases 4510 and 4515 where the current rotating clockwise is applied can switch the core orientation of the magnetic vortex formed in the magnetic free layer 140 from the downward direction of the top surface to the upward direction of the top surface with the smallest current.

At this time, when the FWHM is a reciprocal of the eigenfrequency of the magnetic vortex formed in the magnetic free layer 140, i.e., when it becomes 0.3748 times the resonance period ($\tau_0 = 1/v_0$), power consumption necessary for switching the core orientation of the magnetic vortex formed in the magnetic free layer 140 becomes minimum. That is, it is preferable that pulse voltages having two Gaussian distributions are applied at a time delay of 0.6671 times FWHM through the drive electrodes 150*a*, 150*b*, 151*a* and 151*b* having a FWHM of 0.3748 times the $\tau_0$ of the magnetic vortex formed in the magnetic free layer 140.

Also, the core orientation of the magnetic vortex formed in the magnetic free layer 140 may be switched not once but several times by applying a pulse voltage having a Gaussian distribution. When a voltage having a Gaussian distribution is applied several times, the switching time increases, but it becomes possible to switch the core orientation of the magnetic vortex formed in the magnetic free layer 140 even with a small current. Accordingly, an optimal condition is realized through a simulation. At this time, in order to minimize power consumption, an interval of each pulse is designed to become the resonance period of the magnetic vortex formed in the magnetic free layer 140.

As a result, like in the case where the circularly polarized current is applied, the case where the pulse current is applied can reduce power consumption by applying the current rotating over time rather than applying the linearly polarized current. Also, it is selectable to form the core orientation of the magnetic vortex formed in the magnetic free layer 140 in the upward direction of the top surface or the downward direction of the top surface and thus the perpendicular magnetization of the magnetic vortex can be positioned in a desired direction.

Like in the case where the circularly polarized current is applied to the magnetic free layer 140, the condition for switching the core orientation of the magnetic vortex formed in the magnetic free layer 140 from the upward direction of the top surface to the downward direction in the case where the pulse current is applied is opposite. That is, when the pulse current rotating counterclockwise is applied to the magnetic free layer 140, it becomes possible to switch the core orientation of the magnetic vortex formed in the magnetic free layer 140 from the upward direction of the top surface to the downward direction with the smallest current.

Again Referring to FIG. 5, in operation S630, a value of "0" or "1" is assigned according to the core orientation of the magnetic vortex formed in the magnetic free layer 140.

While the above embodiments show and describe that the core orientation of the magnetic vortex formed in the magnetic free layer 140 is formed in the upward direction or downward direction of the top surface by applying a current whose direction varies with time to the magnetic free layer 140, a case where a magnetic field whose direction varies with time is applied to the magnetic free layer 140 also obtains a similar result. Accordingly, the direction of the magnetic field as applied may be also successively varied with time. Also, a magnetic field whose direction is successively varied with one plane may be applied. This plane may be one parallel to the top surface of the magnetic free layer 140. In addition, a magnetic field whose direction is successively changed at a constant period over time, or whose direction is successively varied with time but magnitude is always constant may be applied. Alternatively, a pulse magnetic field whose direction varies with time may be applied. Preferably, in the case where the magnetic free layer 140 is formed in an elliptical plate shape or a rectangular plate shape, an elliptically polarized magnetic field rotating along a plane parallel to the top surface of the magnetic free layer 140 is applied. Also, in the case where the magnetic free layer 140 is formed in a disk shape or a rectangular plate shape, it is preferable that an elliptically polarized magnetic field rotating along a plane parallel to the top surface of the magnetic free layer 140 is applied.

When a magnetic field is applied to the magnetic free layer 140, the magnetic vortex core in the magnetic free layer 140 moves also. As aforementioned, when the speed of the magnetic vortex core is above the critical speed, the core orientation of the magnetic vortex is switched. Drawings of when the magnetic field is applied are also similar to FIGS. 29 to 32. Accordingly, the case where a magnetic field whose direction varies with time is smaller in power consumption than the case where a magnetic field whose direction is not changed over time. Like the case where a current is applied, in order to switch the core orientation of the magnetic vortex to the upward direction from the top surface of the magnetic free layer 140, it is preferable to apply a magnetic field rotating clockwise to the magnetic free layer 140. In order to switch the core orientation of the magnetic vortex to the downward direction from the top surface of the magnetic free layer 140, it is preferable to apply a magnetic field rotating counterclockwise to the magnetic free layer 140.

In order to apply a magnetic field to the magnetic free layer 140, the configuration of the drive electrodes should be different than the configuration of the drive electrodes of when a current is applied. To apply a magnetic field to the magnetic free layer 140, it may be designed that plurality drive electrodes are disposed to cross each other on or beneath the magnetic free layer 140. For example, as indicated by reference numerals 450 and 451 of FIG. 5, drive electrodes may be disposed to cross each other at an angle of 90 on or beneath the magnetic free layer 140. When a current is applied to the respective drive electrodes 450 and 451, a magnetic field is applied to the magnetic free layer 140.

When sine- or cosine-wave currents having the same frequency and a predetermined phase difference are applied to two drive electrodes 450 and 451, an elliptically polarized magnetic field is applied to the magnetic free layer 140. For example, when sine- or cosine-wave currents having the same frequency, a phase difference of 90 and a different amplitude are applied to two drive electrodes 450 and 451, or when sine- or cosine-wave currents having the same frequency and amplitude and having a phase difference other than 90 are applied to two drive electrodes 450 and 451, an elliptically polarized magnetic field is applied to the magnetic free layer 140. Also, when sine- or cosine-wave currents having the same frequency and amplitude and having a phase difference of 90 are applied to two drive electrodes 450 and 451, a circularly polarized magnetic field is applied to the magnetic free layer 140.

Also, when sine or cosine pulse currents having the same frequency and a predetermined phase difference is applied to the drive electrodes 450 and 451, or when two pulse currents, for example, each having a Gaussian distribution are applied, a pulse magnetic field whose direction varies with time may be applied to the magnetic free layer 140. However, it is noted that two pulse currents should be applied together for a predetermined duration time.

By applying a magnetic field through the above methods, it is possible to form the core orientation of the magnetic vortex formed in the magnetic free layer 140 at a desired position.

FIG. 33 is a schematic perspective view of an MRAM 2900 used in a method for recording information according to an embodiment of the present invention.

Referring to FIG. 33, the MRAM 2900 according to the embodiment of the present invention includes an array of magnetic recording elements 100 of FIG. 1 arranged in rows and columns. The respective magnetic recording elements 100 are connected to each other through drive electrodes 150a, 150b, 151a and 151b formed on a magnetic free layer 140, and a read electrode 110 formed under a magnetic pinned layer 120. The drive electrodes 150a, 150b, 151a and 151b are composed of four electrodes. Of the four drive electrodes 150a, 150b, 151a and 151b, two electrodes 150a and 150b facing each other form one electrode pair 150, and the other two electrodes 151a and 151b facing each other form another electrode pair 151. The read electrode 110 is composed of a single electrode, and extends in a direction between the drive electrode pairs 150 and 151. That is, the read electrode 110 is disposed at an angle of 45° with respect to the two drive electrode pairs 150 and 151. At this time, the read electrodes 110 are arranged in the same direction.

As described above, the respective magnetic recording elements form the array in a configuration that the adjacent magnetic recording elements share the drive electrode and the read electrode. For example, the drive electrode indicated by reference numeral 150b of the drive electrodes 150a, 150b, 151a and 151b included in the magnetic recording element indicated by reference numeral 100 is connected to the magnetic recording element indicated by reference numeral 101. Therefore, the magnetic recording elements indicated by reference numeral 100 and 101 share the drive electrode indicated by reference numeral 150b. Likewise, the magnetic recording elements indicated by reference numerals 100 and 102 share the drive electrode indicated by reference numeral 151b. The read electrode 110 included in the magnetic recording element indicated by reference numeral 100 is connected to the magnetic recording element indicated by reference numeral 103 that is the second closest magnetic recording element. That is, the magnetic recording elements indicated by reference numerals 100 and 103 share the read electrode indicated by reference numeral 110.

FIG. 34 is a schematic perspective view of an MRAM 3200 used in a method for recording information according to another embodiment of the present invention.

The magnetic recording element forming the MRAM 3200 of FIG. 34 is the magnetic recording element 400 of FIG. 5. That is, in the MRAM 3200 of FIG. 34, the magnetic recording elements 400 of FIG. 5 are arranged in rows and columns, and the respective magnetic recording elements 400 form an array so as to share the drive electrodes 450 and 451 and the read electrode 410 with the magnetic recording elements 400 adjacent thereto. The MRAM 3200 of FIG. 34 only differs in the drive electrode structure from the MRAM 2900 of FIG.

33, and other parts correspond to those of the MRAM 2900 of FIG. 33. The drive electrodes 450 and 451 of the MRAM 3200 of FIG. 34 are disposed on the magnetic free layer 440 in a configuration to cross each other at a right angle. As illustrated in FIG. 33, the drive electrodes 450 and 451 connect the closet magnetic recording elements, and the read electrode 410 connects the second closest magnetic recording elements.

The MRAM including an array of the magnetic recording elements of FIG. 5 arranged in rows and columns has not only a configuration of FIG. 34, but also another configuration where the read electrode 410 connects the closest magnetic recording elements and the drive electrodes connect the second closest magnetic recording elements. Number of the drive electrodes may be three or more. Even though the number of the drive electrodes is two, both the two drive electrodes may be formed on the undersurface of the magnetic recording element 440 or formed on the top surface and the undersurface of the magnetic free layer, respectively, which differs the configuration of FIG. 34. The magnetic recording elements may cross each other at an angle other than 90°.

Each of the magnetic recording elements 100, 400 of the MRAMs 2900 and 3200 in FIGS. 32 and 33 should exhibit the same characteristics regardless of its location. To be specific, each of the magnetic recording elements 100, 400 of the MRAMs 2900 and 3200 should exhibit the same response to a current or magnetic field applied to store, record and read information. Therefore, the magnetic recording elements 100, 400, 500 forming the MRAM 2900, 3200 should have the same shape and thickness, and be formed of the same material.

In particular, the MRAM 2900, 3200 is configured such that the magnetic vortexes formed in the magnetic free layers 140 and 440 included in all the magnetic recording elements of the MRAM 2900, 3200 may have the same eigenfrequency. Furthermore, the MRAM 2900, 3200 should be configured such that the rotation direction of the parallel magnetization arranged in parallel with the top surface of the magnetic free layer and arranged around the magnetic vortex core formed in the magnetic free layer 140, 440 may be the same in all the magnetic recording elements.

FIG. 35 is a flowchart illustrating a method for recording information in an MRAM according to an embodiment of the present invention. For reference, it will be described that a method for recording information in an MRAM to be described later is realized using the MRAM 2900 of FIG. 33. However, other MRAMs are also available if they include an array of magnetic recording elements arranged in rows and columns and each of the magnetic recording element includes a magnetic free layer with a magnetic vortex formed, and a plurality of drive electrode pairs disposed to form an ohmic contact with the magnetic layer and connected to the adjacent magnetic recording elements.

Referring to FIG. 35, in operation S3410, an MRAM 2900 is prepared, in which magnetic recording elements 100 are arranged in rows and columns. Here, the magnetic recording element 100 includes a magnetic free layer 140 with a magnetic vortex formed, and four drive electrodes 150a, 150b, 151a and 151b disposed to form an ohmic contact with the magnetic free layer 140. The MRAM 2900 form an array by sharing the drive electrodes 150a, 150b, 151a and 151b with the adjacent magnetic recording elements 100, as illustrated in FIG. 33. To form the magnetic vortex in the magnetic free layer 140, the magnetic free layer 140 provided in the magnetic recording element 100 is formed so as to have the diameter and thickness corresponding to the region II of FIG. 2. Of the four drive electrodes 150a, 150b, 151a and 151b, two electrodes 150a and 150b facing each other form one drive electrode pair, and the other two electrodes 151a and 151b facing each other form another drive electrode pair.

Thereafter, in operation S3420, a voltage is applied to the two drive electrode pairs 150 and 151 included in the magnetic recording element that is selected to record information. The core orientation of the magnetic vortex formed in the magnetic free layer of the selected magnetic recording element is changed to a desired direction by applying a current of which a direction varies with time to the magnetic free layer of the selected magnetic recording element. The core orientation of the magnetic vortex formed in the magnetic free layers included in the other unselected magnetic recording elements are maintained constant.

As described above, the magnetic vortex moves when a current is applied to the magnetic free layer 140 with the magnetic vortex formed. Then, when the moving speed of the magnetic vortex core is beyond a critical speed allowing the core orientation of the magnetic vortex to be switched, the core orientation of the magnetic vortex is switched.

FIG. 36 illustrates a selected magnetic recording element and an unselected magnetic recording element in a method for recording information in an MRAM according to the present invention.

As illustrated in FIG. 36, a current may be applied to an unselected magnetic recording element 3520 besides a selected magnetic recording element 3510 to which information is to be recorded because MRAMs are connected by the drive electrode pair. Therefore, it is required that the core orientation of the magnetic vortex formed in the magnetic free layer of the magnetic recording element 3510 to which a user will record information should be formed in a desired direction whereas the core orientation of the magnetic vortex formed in the magnetic free layer of the unselected magnetic recording element 3520 should not be changed but maintained constant even if the current is applied.

Conditions allowing the core orientation of the magnetic vortex to be switched according to the type of a current applied to the magnetic free layer 140 have been already described with reference to FIG. 29.

That is, the curve indicated by reference numeral 1910 denotes the case of applying an RCP current to the magnetic free layer 140, the curve indicated by reference numeral 1920 denotes the case of applying an LCP current to the magnetic free layer 140, and the curve indicated by reference numeral 1930 denotes the case of applying a linearly polarized current to the magnetic free layer 140. When the current having the conditions corresponding to the respective curves 1910, 1920 and 1930, that is, the circularly polarized current of a constant frequency or linearly polarized current having the magnitude corresponding to the respective curves or greater is applied to the magnetic free layer, the core orientation of the magnetic vortex formed in the magnetic free layer 140 is switched.

As described above, when the RCP current having a frequency equal to the eigenfrequency of the magnetic vortex is applied (see the curve 1910), the core orientation of the magnetic vortex formed in the magnetic free layer 140 can be switched from a downward direction to an upward direction with respect to the top surface of the magnetic free layer 140 using only a current of which magnitude is half the magnitude of the current required in the case (see the curve 1920) of applying the linearly polarized current.

When sine- or cosine-wave AC voltages are applied to only one of the two drive electrode pairs 150 and 151 having the above configuration of FIG. 33, the linearly polarized current flows through the magnetic free layer 140. When, however, sine- or cosine-wave AC voltages having a phase difference of 90° and the same amplitude and frequency are applied to the two drive electrode pairs 150 and 151, the circularly polarized current flows through the magnetic free layer 140.

To record information in the magnetic recording element indicated by reference numeral 3510 in FIG. 36, sine- or cosine-wave AC voltages having a phase difference of 90° and the same amplitude and frequency are applied to the two drive electrode pairs 150 and 151 provided in the magnetic recording element indicated by reference numeral 3510. Resultantly, the circularly polarized current flows through the magnetic recording element indicated by reference numeral 3510 but the linearly polarized current flows through the magnetic recording element indicated by reference numeral 3520.

The applied current should have the magnitude allowing the core orientation of the magnetic vortex formed in the magnetic free layer of the selected magnetic recording element 3510 to be switched from a downward direction to an upward direction with respect to the top surface of the magnetic free layer at a specific frequency. However, not to switch the core orientation of the magnetic vortex formed in the magnetic free layer of the unselected magnetic recording element 3520, the magnitude of applied voltage is adjusted to the condition that the core orientation of the magnetic vortex is not switched in the case where the linearly polarized current is applied. That is, the magnitude of voltage applied through the drive electrode pairs 150 and 151 is adjusted so that a current of which magnitude ranges between the curves 1910 and 1920 of FIG. 29 is applied to the magnetic free layer. If the voltage is applied to the drive electrode pairs 150 and 151 so as to supply the current having the magnitude as above, the core orientation of the magnetic vortex formed in the magnetic free layer of the selected magnetic recording element 3510 is switched, but the core orientation of the magnetic vortex formed in the magnetic free layer of the unselected magnetic recording element 3520 is not switched. That is, information may be recorded only in the selected magnetic recording element 3510.

A voltage having the same frequency as the eigenfrequency of the magnetic vortex formed in the magnetic free layer is applied to the drive electrode pairs 150 and 151 in order that a frequency of the current applied to the magnetic free layer may be equal to the eigenfrequency of the magnetic vortex formed in the magnetic free layer. The reason is to reduce power consumption.

The frequency and amplitude conditions in FIG. 29 for switching the core orientation of the magnetic vortex are similar to those of the case of switching the core orientation of the magnetic vortex formed in the magnetic free layer by applying an elliptically polarized current to the magnetic free layer. Accordingly, the application of the elliptically polarized current provides similar results to the above illustrated in FIG. 29. Even if the applied current is not a circularly polarized current or an elliptically polarized current, it is possible to achieve the similar effect by applying a current of which a direction varies with time.

The core orientation of the magnetic vortex formed in the magnetic free layer of the magnetic recording element 3510 that is selected to store information can be formed in a desired direction even though a pulse current of which a direction varies with time is applied to the magnetic free layer. The above-described conditions in FIGS. 30 through 32 are available to record information only in the selected magnetic recording element 3510 by applying the pulse current to the magnetic free layer 140. In other words, a current having a magnitude ranging between the curve indicated by reference numeral 4210 and the curve indicated by reference numeral 4230, a current having a magnitude ranging between the curve indicated by reference numeral 4310 and the curve indicated by reference numeral 4330, or a current having a magnitude ranging between the curve indicated by reference numeral 4510 and the curve indicated by reference numeral 4530 may be applied to record information only in the selected magnetic recording element 3510 by applying the pulse current to the magnetic free layer 140. When the pulse current corresponding to a portion of a circularly or elliptically polarized current is applied, it should have a frequency equal to the eigenfrequency of the magnetic free layer 140.

Only the core orientation of the magnetic vortex formed in the magnetic free layer of the selected magnetic recording element 3510 can be switched even by applying a linearly polarized current to the magnetic free layer provided in the selected magnetic recording element 3510. As described above, when AC voltages having the same frequency and phase are applied to the drive electrode pairs 150 and 151, or when pulses of the same type are applied through the drive electrode pairs without a time interval therebetween, a linearly polarized current flows through both the selected magnetic recording element 35210 and the unselected magnetic recording element 3520. Even in this case, it is preferable that the frequency of the AC voltage applied to the drive electrode pairs 150 and 151 be equal to the eigenfrequency of the magnetic vortex.

If the voltage is applied to the drive electrode pairs 150 and 151 in this way, the current having the magnitude corresponding to the sum of the linearly in-phase currents flows through the selected magnetic recording element 3510, which is greater than the magnitude of current flowing through the unselected magnetic recording element 3520. By the use of this phenomenon, the linearly current having the magnitude that can switch the core orientation of the magnetic vortex may flow through the selected magnetic recording element 3510, and the linearly current having the magnitude that cannot switch the core orientation of the magnetic vortex may flow through the unselected magnetic recording element 3520.

FIG. 37 illustrates a variation in current density according to a position in the magnetic free layer 140 when the linearly current is applied.

The x-axis of FIG. 37 represents the position in the magnetic free layer 140 provided in the selected magnetic recording element. In FIG. 37, a magnetic layer indicated by reference numeral 3610 has a diameter of 600 nm. The current density of the linearly polarized current applied to the magnetic free layer provided in the selected magnetic recording element 3510 is greater than the current density of the linearly polarized current applied to the magnetic free layer provided in the unselected magnetic recording element 3520.

Therefore, when the applied linearly polarized current has a specific frequency, the magnitude of current applied to the magnetic free layer provided in the selected magnetic recording element 3510 is set to be higher than the magnitudes corresponding to the curve 1930 of FIG. 29, the curve 4230 of FIG. 30, the curve 4330 of FIG. 31, and the curve 4530 of FIG. 32. That is, the magnitude of current applied to the magnetic free layer provided in the selected magnetic recording element 3510 should be equal to or greater than the magnitude of current that can switch the magnetic vortex core during the application of the linearly current. The magnitude of current applied to the magnetic free layer provided in the unselected magnetic recording element 3520 is set to be smaller than the magnitudes corresponding to the curve 1930 of FIG. 29, the curve 4230 of FIG. 30, the curve 4330 of FIG. 31, and the curve 4530 of FIG. 32. That is, the magnitude of current applied to the magnetic free layer provided in the unselected magnetic recording element 3520 is set to be smaller than the magnitude of current allowing the magnetic vortex core to be switched during the application of the linearly polarized current. The current having the magnitude corresponding to the above condition flows as illustrated in FIG. 37, and thus information can be recorded only in the selected magnetic recording element 3510 by applying this current.

Referring back to FIG. 5, in operation S3430, "0" or "1" is assigned according to the core orientation of the magnetic vortex of the magnetic recording element.

While the aforesaid embodiments show and describe the method for recording information in only a selected magnetic recording element to which information will be recorded by applying a current to the MRAM. In this case, however, it is noted that the drive electrodes provided in the magnetic recording element of the MRAM are not in ohmic contact with the magnetic free layer, but the drive electrodes 450 and 451 are formed on or beneath the magnetic free layer in a configuration to cross each other, as illustrated in FIG. 34. Desirably, the drive electrodes 450 and 451 may be disposed to cross each other at a right angle. A magnetic field is applied through the drive electrodes 450 and 451 having the above configuration, thus forming the core orientation of the magnetic vortex formed in the magnetic free layer of the selected magnetic recording element in a desired direction. The core orientation of the magnetic vortex formed in the magnetic free layers of the other unselected magnetic recording elements may be maintained equal to the core orientation of the magnetic vortex of the previous state before the application of the magnetic field.

An elliptically polarized magnetic field may be applied by applying sine- or cosine-wave AC currents having a predetermined phase difference and the same frequency to the two drive electrodes 450 and 451. In particular, when since- or cosine-wave AC currents having a phase difference of 90° and the same amplitude and frequency are applied to the two drive electrodes 450 and 451, a circularly magnetic field is applied to the magnetic free layer. When in-phase AC currents having the same frequency are applied to the two drive electrodes 450 and 451, a linearly polarized magnetic field is applied to the magnetic free layer.

It is also possible to achieve the similar effect by applying a pulse magnetic filed instead of applying such a continuous magnetic field. To this end, sine- or cosine-wave AC currents having a predetermined phase difference and the same frequency may be applied to the two drive electrodes 450 and 451. At this time, a time interval between the two successive sine- or cosine-wave AC currents applied through the two drive electrodes 450 and 451 may be a quarter of a period. Thus, the voltage applied to the magnetic free layer has a portion of a circularly polarized magnetic field Also, two pulse currents applied through the two drive electrodes 450 and 451 may have a predetermined time internal therebetween. However, the two pulse currents should be applied together for at least a predetermined duration so as to apply a pulse magnetic field to the magnetic free layer. The applied current may be a pulse current having a Gaussian distribution. The pulse currents having Gaussian distributions, which are applied through the two drive electrodes 450 and 451, are identical to each other in an average value and FWHM, and a time interval between the two pulse currents may be 0.6671 times the FWHM. If the pulse currents are applied in this manner, magnitude and direction traces of the voltage applied to the magnetic free layer over time approach a circular form.

Frequency and amplitude conditions, which allow the core orientation of the magnetic vortex to be switched when a linearly polarized magnetic field or a circularly magnetic field is applied, are similar to the conditions of FIG. 7. Furthermore, conditions allowing the core orientation of the magnetic vortex to be switched when a pulse magnetic field is applied are similar to the conditions of FIGS. 29 through 32. Consequently, by the use of such conditions, the core orientation of the magnetic vortex formed in the magnetic free layer of the selected magnetic recording element can be formed in a desired direction, and the core orientation of the magnetic vortex formed in the magnetic free layers included in the other unselected magnetic recording elements can be maintained constant.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method for recording information in a magnetic recording element comprising:
preparing the magnetic recording element having a magnetic free layer in which a magnetic vortex is formed;
switching a core orientation of the magnetic vortex formed in the magnetic free layer to an upward direction or downward direction from a top surface of the magnetic free layer by applying to the magnetic free layer a current or a magnetic field whose direction varies with time successively on a single plane, which is parallel to the top surface of the magnetic free layer; and
assigning "0" or "1" according to the direction of the core orientation of the magnetic vortex formed in the magnetic free layer.

2. The method of claim 1, wherein the switching a core orientation of a magnetic vortex formed in the magnetic free layer to an upward direction or downward direction from a top surface of the magnetic free layer comprises:
applying a current or magnetic field whose direction varies with time to the magnetic free layer in which the magnetic vortex is formed such that a speed of the magnetic vortex core having the downward core orientation from the top surface of the magnetic free layer is above a critical speed and a speed of the magnetic vortex core having the upward core orientation from the top surface of the magnetic free layer is below the critical speed, and
applying a current or magnetic field whose direction varies with time to the magnetic free layer in which the magnetic vortex is formed such that the speed of the magnetic vortex core having the downward core orientation from the top surface of the magnetic free layer is below the critical speed and the speed of the magnetic vortex core having the upward core orientation from the top surface of the magnetic free layer is above the critical speed.

3. The method of claim 1, wherein the magnetic free layer is formed in an elliptical plate or rectangular plate shape, wherein the switching a core orientation of a magnetic vortex formed in the magnetic free layer to an upward direction or downward direction from a top surface of the magnetic free layer comprises applying an elliptically polarized current or an elliptically polarized magnetic field to the magnetic free layer in which the magnetic vortex is formed.

4. The method of claim 3, wherein the applied current or magnetic field has a frequency which is the same as an eigenfrequency of the magnetic vortex formed in the magnetic free layer.

5. The method of claim 1, wherein the magnetic free layer is formed in a disk or square plate shape, wherein the switching a core orientation of a magnetic vortex formed in the magnetic free layer to an upward direction or downward direction from a top surface of the magnetic free layer comprises applying a circularly polarized current or a circularly polarized magnetic field to the magnetic free layer in which the magnetic vortex is formed.

6. The method of claim 5, wherein the applied current or magnetic field has a frequency which is the same as an eigenfrequency of the magnetic vortex formed in the magnetic free layer.

7. The method of claim 1, wherein the switching a core orientation of a magnetic vortex formed in the magnetic free layer to an upward direction or downward direction from a top surface of the magnetic free layer comprises:
applying a current or magnetic field rotating clockwise with respect to the top surface of the magnetic free layer to switch the core orientation of the magnetic vortex formed in the magnetic free layer to the upward direction from the top surface of the magnetic free layer, or
applying a current or magnetic field rotating counterclockwise with respect to the top surface of the magnetic free layer to switch the core orientation of the magnetic vortex formed in the magnetic free layer to the downward direction from the top surface of the magnetic free layer.

8. The method of claim 7, wherein the current rotating clockwise is a right circularly polarized current or a right elliptically polarized current,
the magnetic field rotating clockwise is a right circularly polarized magnetic field or a right elliptically polarized magnetic field,
the current rotating counterclockwise is a left circularly polarized current or a left elliptically polarized current, and
the magnetic field rotating counterclockwise is a left circularly polarized magnetic field or a left elliptically polarized magnetic field.

9. The method of claim 1, wherein the magnetic recording element further comprises two drive electrode pairs disposed to ohmic-contact the magnetic free layer, four drive electrodes constituting the two drive electrode pairs are disposed at 90° intervals along a circumferential direction of the magnetic free layer, the two drive electrodes facing each other form one of the two drive electrode pairs and the remaining two drive electrodes facing each other form the other of the two drive electrode pairs.

10. The method of claim 9, wherein the switching a core orientation of a magnetic vortex formed in the magnetic free layer to an upward direction or downward direction from a top surface of the magnetic free layer comprises applying sine- or cosine-wave AC voltages having a phase difference and the same frequency to the two drive electrode pairs.

11. The method of claim 10, wherein the applied sine- or cosine-wave AC voltages have the same amplitude and a phase difference of 90°,
wherein the applied sine- or cosine-wave AC voltage have a frequency which is the same as an eigenfrequency of the magnetic vortex formed in the magnetic free layer.

12. The method of claim 9, wherein the switching a core orientation of a magnetic vortex formed in the magnetic free layer to an upward direction or downward direction from a top surface of the magnetic free layer comprises applying a pulse voltage having two Gaussian distributions at a time interval.

13. The method of claim 12, wherein the switching a core orientation of a magnetic vortex formed in the magnetic free layer to an upward direction or downward direction from a top surface of the magnetic free layer comprises applying two or more pulse voltages at a time interval through the two drive electrode pairs, the time interval being set as a reciprocal of an eigenfrequency of the magnetic vortex formed in the magnetic free layer.

14. The method of claim 12, wherein the magnetic recording element further comprises two drive electrodes to perpendicularly cross each other at least on or beneath the magnetic free layer.

15. The method of claim 14, wherein the switching a core orientation of a magnetic vortex formed in the magnetic free layer to an upward direction or downward direction from a top surface of the magnetic free layer comprises applying sine- or cosine-wave AC currents having a phase difference and the same frequency to the two drive electrodes.

16. The method of claim 15, wherein the applied sine- or cosine-wave AC currents have the same amplitude and a phase difference of 90°,
wherein the applied sine- or cosine-wave AC currents have a frequency which is the same as an eigenfrequency of the magnetic vortex formed in the magnetic free layer.

17. The method of claim 14, wherein the switching a core orientation of a magnetic vortex formed in the magnetic free layer to an upward direction or downward direction from a top surface of the magnetic free layer comprises applying pulse currents having two Gaussian distributions at a time interval to the two drive electrodes.

18. The method of claim 17, wherein the switching a core orientation of a magnetic vortex formed in the magnetic free layer to an upward direction or downward direction from a top surface of the magnetic free layer comprises applying two or more pulse currents at a time interval through the two drive electrodes, the time interval being set as a reciprocal of an eigenfrequency of the magnetic vortex formed in the magnetic free layer.

* * * * *